United States Patent [19]

Kurita et al.

[11] Patent Number: 5,311,034
[45] Date of Patent: May 10, 1994

[54] INDIUM PHOSPHIDE GUNN DIODE WITH DOPANT GRADIENT

[75] Inventors: Hiroshi Kurita; Akihito Yokohata; Atsushi Kodama; Kazuhiko Suga, all of Toda, Japan

[73] Assignee: Nippon Mining Co., Ltd., Japan

[21] Appl. No.: 705,673

[22] Filed: May 24, 1991

[30] Foreign Application Priority Data

May 28, 1990 [JP] Japan .................. 2-135455

[51] Int. Cl.$^5$ .................. H01L 47/02
[52] U.S. Cl. .................. 257/6; 257/655; 257/615
[58] Field of Search .................. 357/3; 257/6, 7, 8, 257/655, 615

[56] References Cited

PUBLICATIONS

H. Kurita et al., "W-Band InP Gunn Diodes with Optimized Linearly Graded Doping Profiles", Apr. 1991, *Conference Digest*, p. 81.
John Ondria and Raymond L. Ross, "Enhanced Ted MMW Device Performance Using Graded Doping Profiles", Sep. 1987, *17th European Microwave Conference*, pp. 673-680.
A. Yokohata et al., "Millimeter-Wave InP Gunn diodes with Linearly Graded Profiles Grown by Low Pressure MOCVD", Sep. 18-21, 1990, *The 3rd Asia-Pacific Microwave Conference Proceedings*, pp. 1135-1138.
John Ondria and Raymond L. Ross, "Improved Performance of Fundamental and Second Harmonic MMW Oscillators Through Active Doping Concentration Contouring", 1987, *IEEE MTT-S Digest*, pp. 977-980.
J. M. Szubert et al., "W-Band GaAs Gunn Diodes with High Output Power", Sep. 1990, *Solid-State Electronics*, vol. 33, No. 8, pp. 1035-1037.
H. Kurita et al., "W-Band InP Gunn Diodes with Optimized Linearly Graded Doping Profiles", Apr. 1991, *Conference Digest*, p. 81.
John Ondria and Raymond L. Ross, "Enhanced Ted MMW Device Performance Using Graded Doping Profiles", Sep. 1987, *17th European Microwave Conference*, pp. 673-680.
A. Yokohata et al., "Millimeter-Wave InP Gunn Diodes with Linearly Graded Profiles Grown by Low Pressure MOCVD", Sep. 18-21, 1990, *The 3rd Asia-Pacific Microwave Conference Proceedings*, pp. 1135-1138.
John Ondria and Raymond L. Ross, "Improved Performance of Fundamental and Second Harmonic MMW Oscillators Through Active Device Doping Concentration Contouring", 1987, *IEEE MTT-S Digest*, pp. 977-980.
J. M. Szubert et al., "W-Band GaAs Gunn Diodes with High Output Power", Sep. 1990, *Solid-State Electronics*, vol. 33, No. 8, pp. 1035-1037.
S. M. Sze, "Physics of Semiconductor Devices, Second Edition", 1981, pp. 646 and 649.
F. B. Frank et al., "High Efficiency Millimetre Wave Oscillators and Amplifiers", *Electronic Engineering*, Jun. 1985, pp. 39-42.

*Primary Examiner*—William D. Larkins
*Attorney, Agent, or Firm*—Jones & Askew

[57] ABSTRACT

A Gunn diode in which the conversion efficiency can be improved without lowering the reliability, by reducing the dead zone while maintaining n+nn+ structure. In this Gunn diode, the donor impurity concentration in the n-type active layer is graded along a direction perpendicular to a contact plane between the n-type active layer and the n+-type layers, and an average concentration gradient of the donor impurity concentration in the n-type active layer simultaneously satisfies the following two inequalities: $G > (A_1 N/L) \exp(-NL/S_1)$ and $G < (A_2 N/L) \exp(-NL/S_2)$, where L is a thickness of the n-type active layer, N is an average concentration of the donor impurity, $S_1 = 0.87 \times 10^{12}$ cm$^{-2}$ is a constant, $S_2 = 1.32 \times 10^{12}$ cm$^{-2}$ is a constant, $A_1 = 2.0$ is a constant, and $A_2 = 9.0$ is a constant.

10 Claims, 22 Drawing Sheets

● : Q OVER 1.3

○ : Q BELOW 1.3

INDIUM PHOSPHIDE GUNN DIODE WITH DOPANT GRADIENT

BACKGROUND OF THE INVENTION

1. Field of the Invention

The present invention relates to a Gunn diode using an InP semiconductor to be used as a microwave source or a millimeter wave source.

2. Description of the Background Art

It is well known that a drift velocity of conduction electrons in an InP semiconductor has a property called negative differential resistance, i.e., it decreases for an electric field strength greater than a certain level. This is graphically shown in FIG. 1, where a vertical axis represents a drift velocity V of the conduction electron and a horizontal axis represents an electric field strength E. As shown in FIG. 1, in a region A1 the drift velocity V increases as the electric field strength E increases, so that the differential resistance which is inversely proportional to dV/dE has a positive value in this region A1. On the other hand, in a region A2 the drift velocity V decreases as the electric field strength E increases until it reaches to a saturation velocity Vs, so that the differential resistance has a negative value in this region A2, and the drift velocity is said to have a property called the negative differential resistance.

This negative differential resistance is caused by the fact characteristic to this type of a semiconductor that the effective mass of the conduction electron at a high energy level is heavier than an effective mass of the conduction electron at a low energy level.

A Gunn diode which utilizes this property of the negative differential resistance is widely used as a solid state oscillator element for generating microwaves and millimeter waves.

An example of a conventional Gunn diode is shown in FIG. 2, where the Gunn diode comprises an n-type active layer 3 sandwiched by two n+-type layers 4 and 5, where metallic electrodes 6 and 7 are connected to the n+-type layers 4 and 5, respectively. A distribution of a donor impurity concentration Nd in this Gunn diode of FIG. 2 is shown in FIG. 3. Here, the contacts between the n+-type layers 4 and 5 and the metallic electrodes 6 and 7 can easily be made to be ohmic contacts, because the donor concentration of the n+-type layers 4 and 5 is sufficiently high as shown in FIG. 3.

In this configuration, by setting a thickness and the donor impurity concentration of the active layer 3 appropriately, and applying an appropriate DC voltage between the two electrodes 6 and 7, a structure called a Gunn domain can be formed in an negative electrode side (cathode side) of the active layer 3, due to the negative differential resistance property of the semiconductor conduction electrons. In the Gunn domain, a region in which the conduction electron concentration is greater than surrounding (accumulation layer) or a portion at which a region with greater conduction electron concentration and a region with less conduction electron concentration are facing each other (dipole layer) is generated, and such a portion moves toward the positive electrode side (anode side) of the active layer 3. Such a Gunn domain disappears when it reaches to the n+-type layer of the anode side, and then another Gunn domain is generated at the cathode side.

As this disappearance of an old Gunn domain and an appearance of a new Gunn domain is repeated, it appears that an AC current is superposed onto a DC current between the electrodes, where the frequency of this AC current is the characteristic frequency of the Gunn diode which is mainly determined from a time for the Gunn domain to move through the active layer 3 from the cathode side to the anode side. On the other hand, the velocity of the Gunn domain in the active layer 3 is approximately equal to the saturation velocity Vs of the conduction electrons, so that the characteristic frequency f of the Gunn diode is roughly given as f=Vs/L where L is a thickness of the active layer 3. Conversely, an appropriate thickness L of the active layer 3 can be given as a function of the desired characteristic frequency f in a form of L=Vs/f. Thus, it can be said that the thickness of the active layer is roughly inversely proportional to the characteristic frequency f.

Such a Gunn diode is widely used as an oscillator for high frequency waves. For example, the high frequency electromagnetic waves such as the microwaves can be obtained from the Gunn diode by appropriately arranging the Gunn diode inside a resonant cavity. Such an oscillator using the Gunn diode is called a Gunn oscillator, for which the most important quality index is a conversion efficiency indicating how much AC output can be obtained from a given DC power input, and the improvement of this conversion efficiency in the Gunn oscillator has been a major problem associated with a conventional Gunn oscillator.

Now, in such a Gunn diode having n+nn+ structure, it is known that the Gunn domain is generated not exactly at a contact plane between the active layer and the cathode side n+-type layer, but at a position inside the active layer which is a certain distance inward from the contact plane, as shown in FIG. 4. This FIG. 4 shows a result of a computer simulation of a Gunn domain movement, which clearly indicates an existence of a region A nearby the cathode side n+-type layer contact plane in which no Gunn domain is present.

This phenomenon can be explained as follows. Namely, the conduction electrons entering into the active layer have not gained sufficient amount of energy from the electric field so that their energy is not sufficiently high for realizing the negative differential resistance property which is indispensable for the formation of the Gunn domain. On the other hand, as the conduction electrons passes through the active layer for a while, these conduction electrons are raised to the high energy states and start to have the negative differential resistance property, so that the formation of the Gunn domain become possible.

The region A between the cathode side n+-type layer contact plane and the actual Gunn domain generation position where no Gunn domain is called a dead zone. The existence of this dead zone severely damages the characteristics of the Gunn diode, so that it is highly desirable to make this dead zone as small as possible, or to remove this dead zone completely. In particular, in a case of using the Gunn diode for an application using a high frequency over 40 GHz, the appropriate thickness of the active layer becomes as thin as less than 2 μm as explained above, so that the thickness of the dead zone becomes unignorable compared with the thickness of the active layer, and the existence of the dead zone affects the conversion efficiency of the Gunn diode considerably.

As a method of removing the dead zone, there is known a configuration in which the cathode side n+- type layer is removed and the metallic electrode is connected directly to the active layer on the cathode side, as shown in FIG. 5. In this configuration of FIG. 5, where the anode side metallic electrode 9 remains to contact with the anode side n+-type layer 5, while the cathode side metallic electrode 8 is directly contacting the n-type active layer 3. In such a configuration, the contact between the active layer 3 and the cathode side metallic electrode 8 is not an ohmic contact but a Schottky contact, so that the dead zone can be removed completely by appropriately setting the characteristic of this Schottky contact, and as a result the conversion efficiency can be improved.

However, in the Gunn diode of this configuration, the appropriate setting of the Schottky contact is extremely difficult because a minute change in the Schottky contact can affect the Gunn diode characteristic considerably. In addition, compared with the ohmic contact, the Schottky contact is far more difficult technically to manufacture at a high reproducibility. Furthermore, the characteristic of the Schottky contact is quite sensitive to the environmental temperature, so that the reliability of this type of Gunn diode has been rather low.

SUMMARY OF THE INVENTION

It is therefore an object of the present invention to provide a Gunn diode in which the conversion efficiency can be improved without lowering the reliability, by reducing the dead zone while maintaining n+nn+ structure.

According to one aspect of the present invention there is provided a Gunn diode, comprising: an n-type active layer made of an InP semiconductor body; and two n+-type layers sandwiching the n-type active layer, each of which is having a donor concentration greater than the n-type active layer and connected with a metallic electrode; wherein the donor impurity concentration in the n-type active layer is graded along a direction perpendicular to a contact plane between the n-type active layer and the n+-type layers, and an average concentration gradient G of the donor impurity concentration in the n-type active layer simultaneously satisfies the following two inequalities: $C>(A_1N/L)\exp(-NL/S_1)$ and $G<(A_2N/L)\exp(-NL/S_2)$, where L is a thickness of the n-type active layer, N is an average concentration of the donor impurity in the n-type active layer, $S_1=0.87\times 10^{12}$ cm$^{-2}$ is a constant, $S_2=1.32\times 10^{12}$ cm$^{-2}$ is a constant, $A_1=2.0$ is a constant, and $A_2=9.0$ is a constant.

According to another aspect of the present invention there is provided Gunn diode, comprising: an n-type active layer made of an InP semiconductor body; and two n+-type layers sandwiching the n-type active layer, each of which is having a donor concentration greater than the n-type active layer and connected with a metallic electrode; wherein the donor impurity concentration in the n-type active layer is graded along a direction perpendicular to a contact plane between the n-type active layer and the n+-type layers, and an average concentration gradient G of the donor impurity concentration in the n-type active layer simultaneously satisfies the following three inequalities: $G>(A_1N/L)\exp(-NL/S_3)$, $G<(A_3N/L)\exp(-NL/S_4)$, and $G<2N/L$, where L is a thickness of the n-type active layer, N is an average concentration of the donor impurity in the n-type active layer, $S_3=1.2\times 10^{12}$ cm$^{-2}$ is a constant, $S_4=4.0\times 10^{12}$ cm$^{-2}$ is a constant. $A_1=2.0$ is a constant, and $A_3=3.4$ is a constant.

Other features and advantages of the present invention will become apparent from the following description taken in conjunction with the accompanying drawings.

DETAILED DESCRIPTION OF THE PREFERRED EMBODIMENTS

Now, the generic feature of the present invention will be described.

According to one embodiment of the present invention, there is provided a Gunn diode comprising: an n-type active layer made of an InP semiconductor body; and two n+-type layers sandwiching the n-type active layer, each of which is having a donor concentration greater than the n-type active layer and connected with a metallic electrode either directly or indirectly; where the donor impurity concentration in the n-type active layer is graded along a direction perpendicular to a contact plane between the n-type active layer and the n+-type layers, and its average concentration gradient G simultaneously satisfies the following two inequalities:

$$G > (A_1 N/L) \exp(-NL/S_1) \quad (1)$$

$$G < (A_2 N/L) \exp(-NL/S_2) \quad (2)$$

where L is a thickness of the n-type active layer, N is an average concentration of the donor impurity, $S_1 = 0.87 \times 10^{12}$ cm$^{-2}$ is a constant, $S_2 = 1.32 \times 10^{12}$ cm$^{-2}$ is a constant, $A_1 = 2.0$ is a constant, and $A_2 = 9.0$ is a constant.

In this Gunn diode, it is preferable for the donor impurity concentration of the n-type active layer to have the substantially constant concentration gradient.

Moreover, it is also preferable for the donor impurity concentration of the n-type active layer to be constant at a prescribed region neighboring a cathode side end of the n-type active layer and have the substantially constant concentration gradient in the remaining region.

Furthermore, it is also preferable for the thickness L of the n-type active layer to be not greater than 2 μm, and a product NL of the thickness L of the n-type active layer and the average concentration N of the donor impurity to be not greater than $2.0 \times 10^{12}$ cm$^{-2}$.

This configuration has an advantage of preventing the appearance of the dead zone and thereby improving the conversion efficiency without lowering the reliability while maintaining the n+nn+ structure, for the reason to be explained in detail below.

Figure 1:
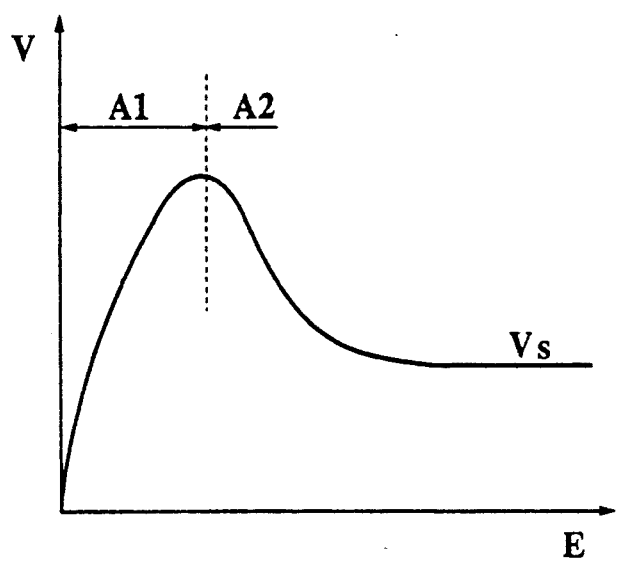
FIG. 1 is a graph of a drift velocity versus an electric field strength, showing a negative differential resistance property of a Gunn diode.
Figure 2:
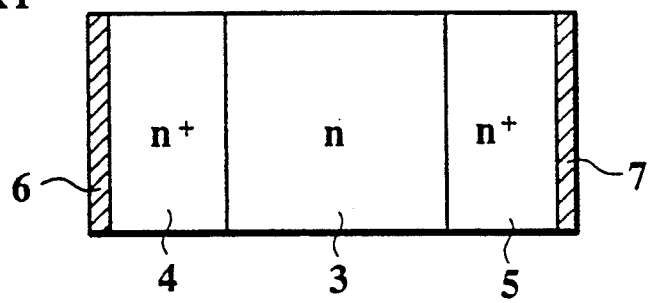
FIG. 2 is a schematic diagram showing a configuration of an example of a conventional Gunn diode.
Figure 3:
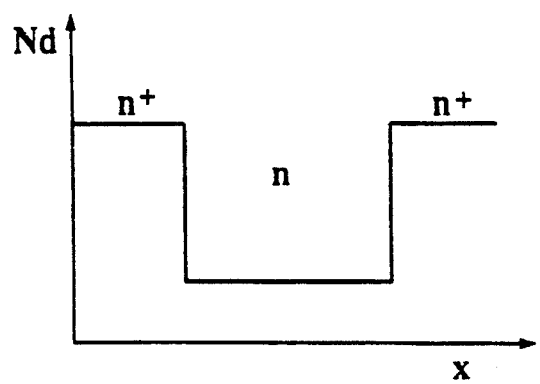
FIG. 3 is a graph of a distribution of a donor impurity concentration in the conventional Gunn diode of FIG. 2.
Figure 4:
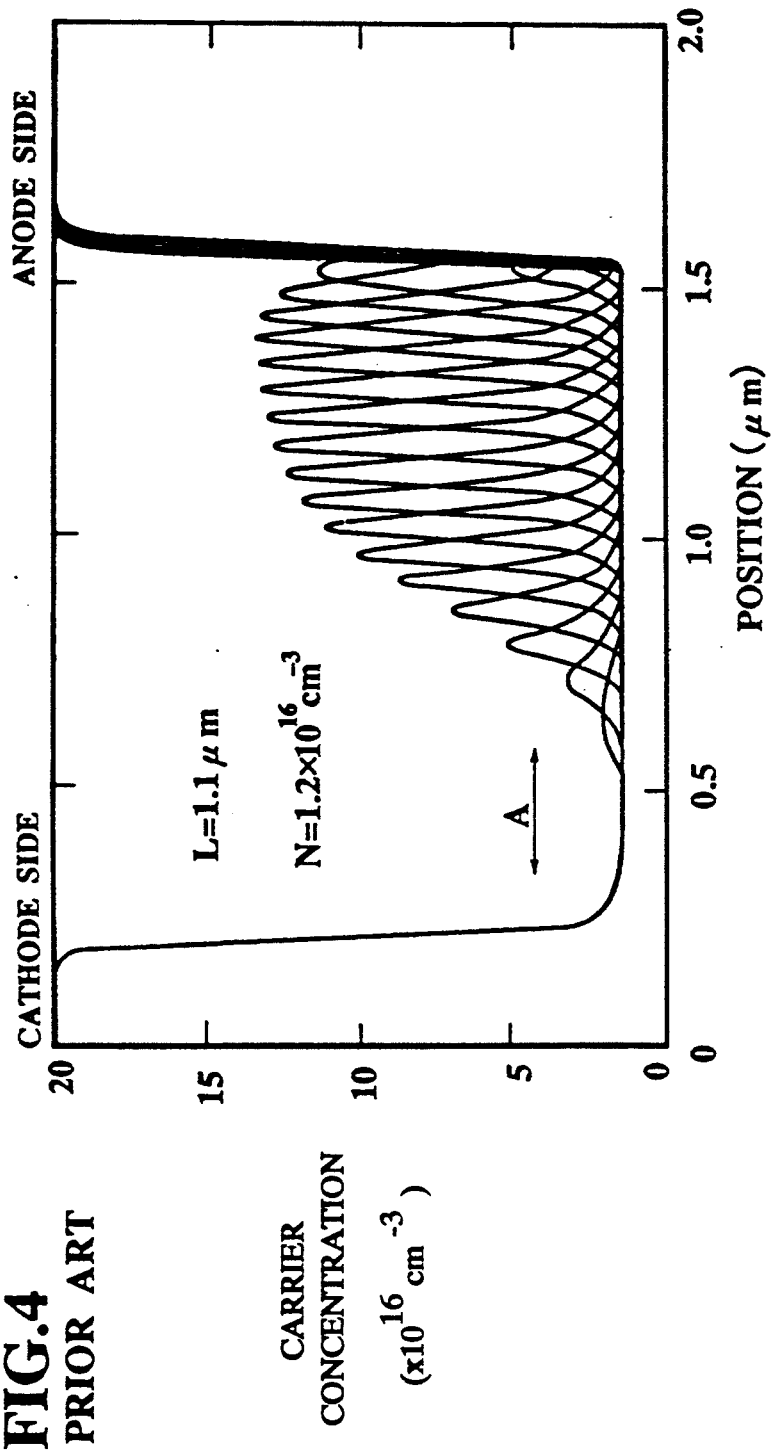
FIG. 4 is a graph of a carrier concentration in the conventional Gunn diode of FIG. 2 at 16 different timings within a single period, showing an existence of a dead zone.
Figure 5:
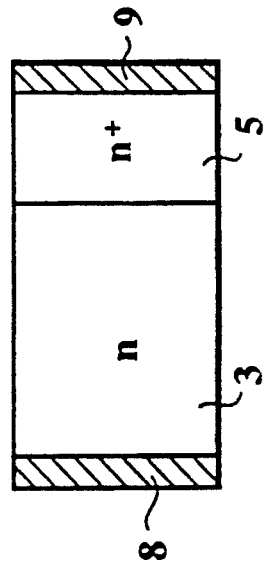
FIG. 5 is a schematic diagram showing a configuration of another example of a conventional Gunn diode, in which the dead zone is removed.
Figure 6:
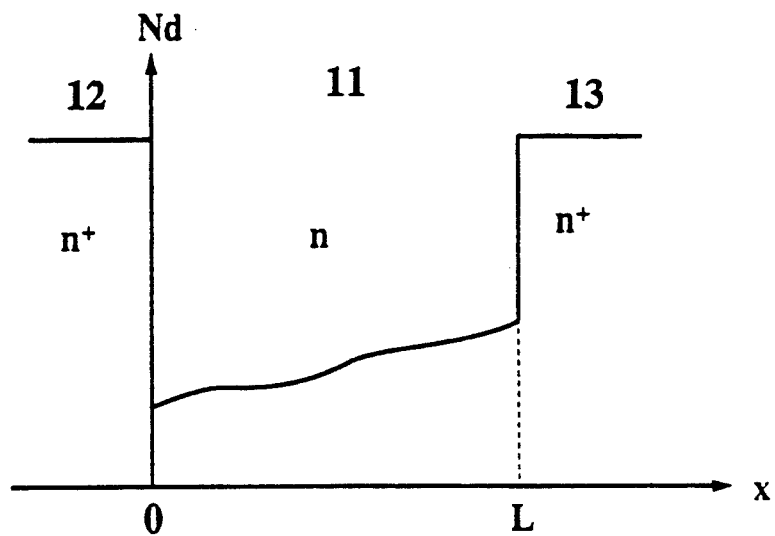
FIG. 6 is a graph of a distribution of a donor impurity concentration in a generic configuration of a Gunn diode according to the present invention.

The basic idea underlying this embodiment of the present invention is that, as shown in FIG. 6, in an InP Gunn diode having the n+nn+ structure, the size of the dead zone can be made smaller by providing an appropriate average concentration gradient G in a direction perpendicular to the contact plane between the n-type active layer 11 and the n+-type layers 12 and 13.

By analyzing the relationships between the average concentration gradient G in the n-type active layer 11 and the conversion efficiency of a Gunn oscillator using such a Gunn diode, the following results had been obtained by the present inventors.

First of all, it was found that among a group of Gunn diodes having the same average impurity concentration N and the same active layer thickness L, one for which the average concentration gradient G is set up appropriately has much superior conversion efficiency compared with the Gunn diode having a uniform active layer impurity concentration distribution.

Secondly, it was also found that for a quantity $\alpha$ given by:

$$\alpha = GL/(2N) \quad (3)$$

which is the average concentration gradient G normalized by 2N/L, there is a relationship between a range of $\alpha$ for which the improvement of the conversion efficiency with respect to the Gunn diode without the donor impurity concentration gradient is prominent and a value of a product NL of the average impurity concentration N and the active layer thickness L. According to this relationship, the range of $\alpha$ for which the improvement of the conversion efficiency with respect to the Gunn diode without the donor impurity concentration gradient is prominent can be expressed by the inequalities (1) and (2) described above.

These observations are based on the following results of numerical simulation experiments.

Figure 7:
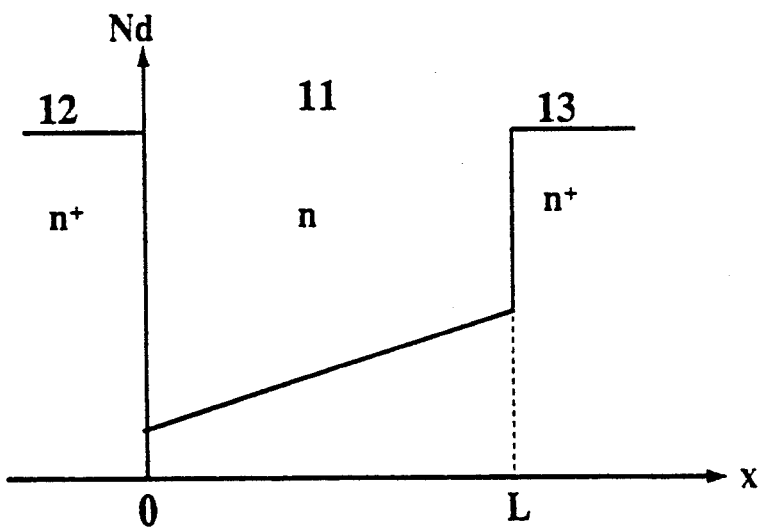
FIG. 7 is a graph of a distribution of a donor impurity concentration in one exemplary configuration of a Gunn diode according to the present invention.
Figure 8:
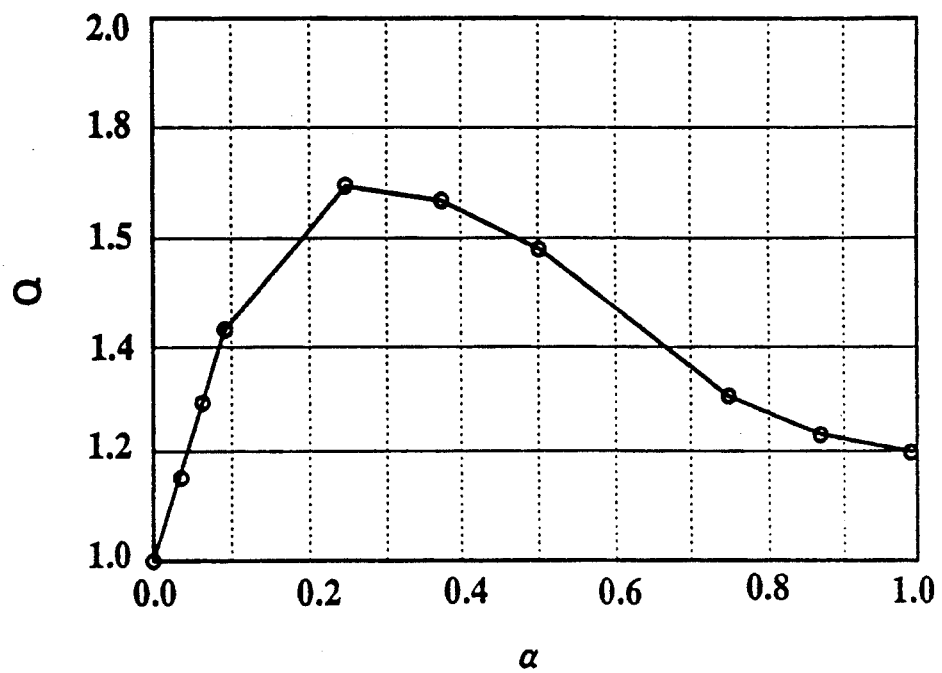
FIGS. 8 to 13 are graphs showing numerically simulated relationships between a conversion efficiency rate and a quantity α for the Gunn diodes having said one exemplary configuration of FIG. 7 with various settings summarized in the table 1.
Figure 9:
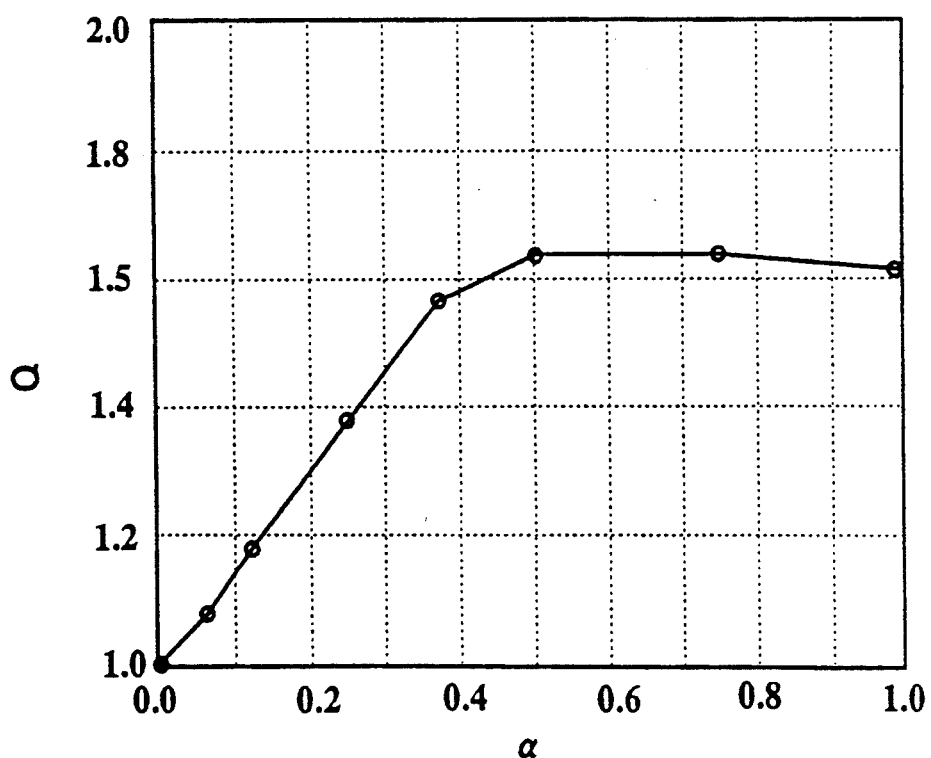
Figure 10:
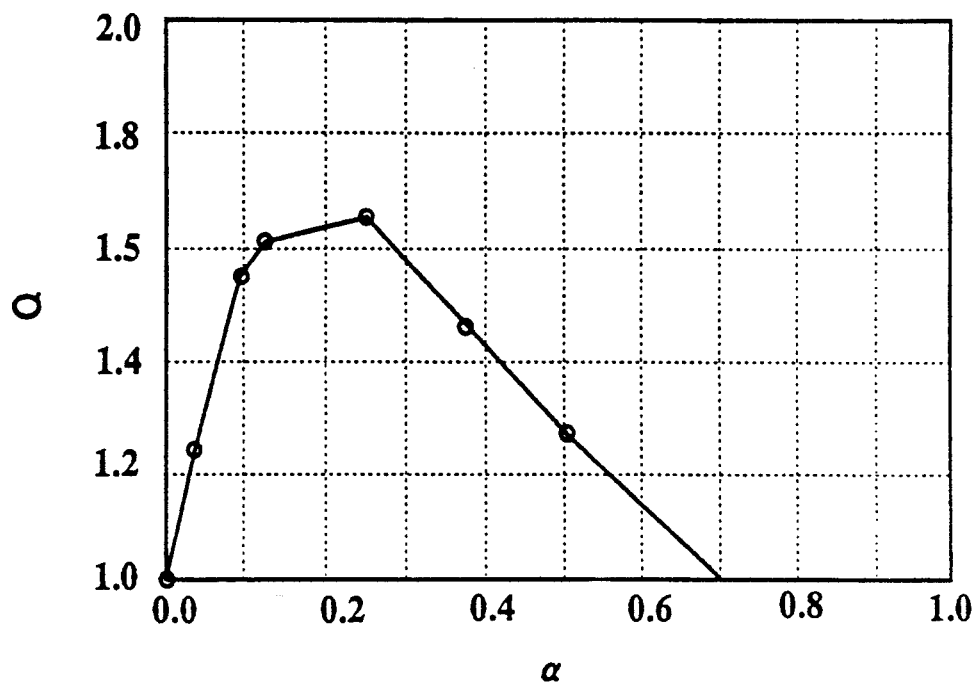
Figure 11:
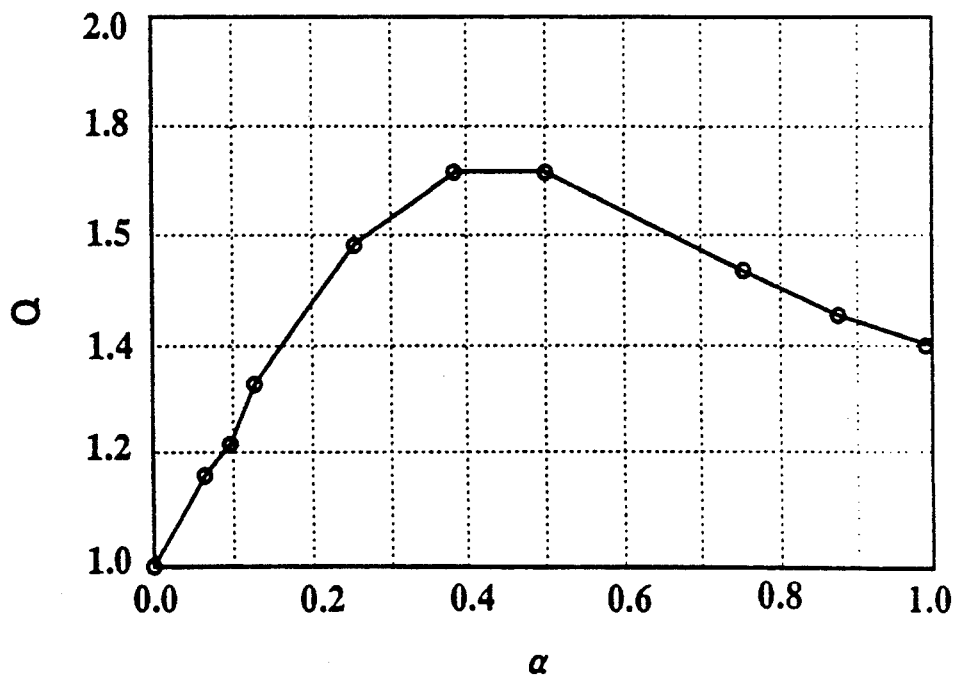
Figure 12:
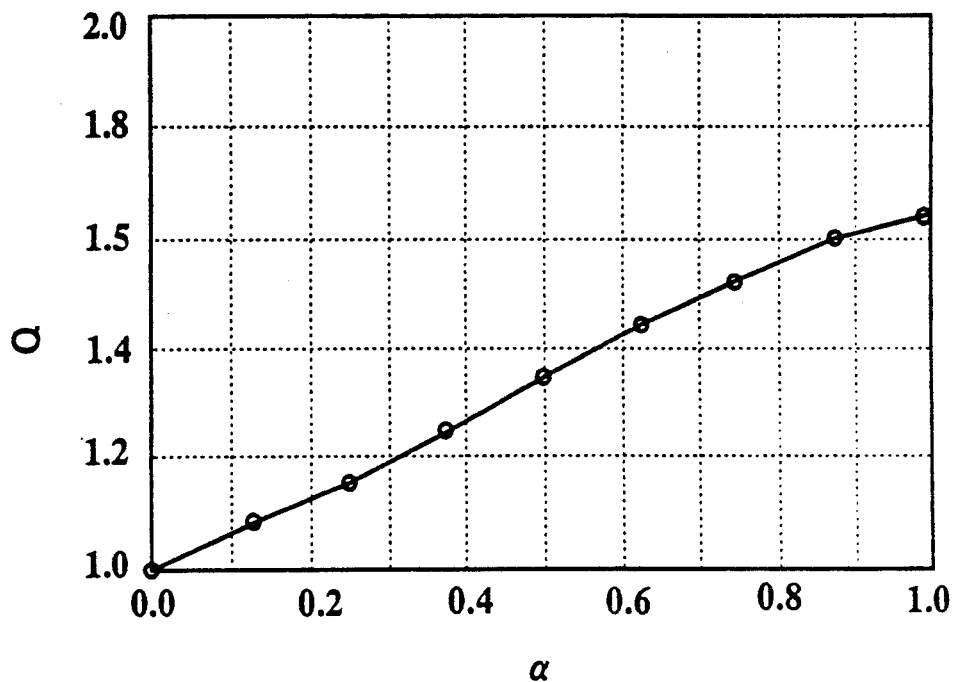
Figure 13:
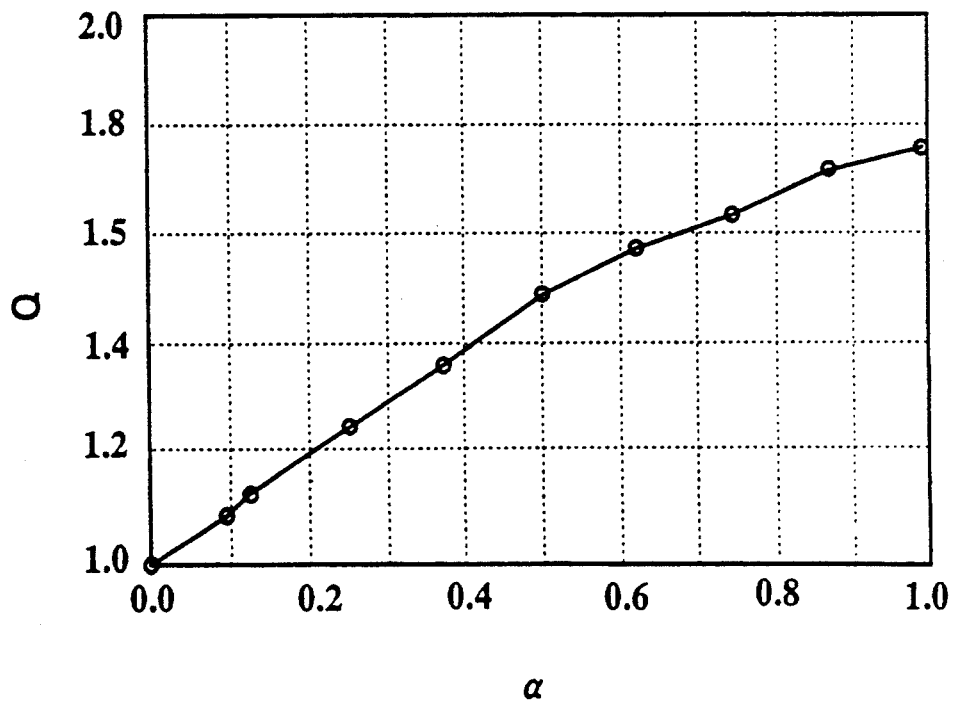

First, the numerical simulation experiment was conducted to study a dependency of a conversion efficiency rate Q on $\alpha$ for a group of InP Gunn diodes having a gradient of the impurity concentration Nd(x) which is substantially constant throughout the n-type active layer as shown in FIG. 7, in which case Nd(x) can be expressed as:

$$Nd(x) = N[1 + 2\alpha(x/L - \tfrac{1}{2})] \quad (4)$$

where x is a coordinate variable ranging from 0 at the contact plane between the n-type active layer 11 and one of the n+-type layer 12 to L at the contact plane between the n-type active layer 11 and the other one of the n+-type layer 13. Here, the conversion efficiency rate Q is defined as the conversion efficiency eff of each Gunn diode diode having a uniform active layer impurity concentration distribution and the same N and L, i.e., Q = eff/eff(0).

The results obtained by this experiment for various settings of L and N summarized in the table 1 below are shown in FIG. 8 to FIG. 13 in which a vertical axis represents the conversion efficiency rate Q while a horizontal axis represents $\alpha$.

TABLE 1

| FIG. No. | L (μm) | N ($\times 10^{16}$ cm$^{-3}$) |
|---|---|---|
| 8 | 0.8 | 3.0 |
| 9 | 1.1 | 1.2 |
| 10 | 1.5 | 2.0 |
| 11 | 1.2 | 1.4 |
| 12 | 1.1 | 0.6 |
| 13 | 1.0 | 1.0 |

These Gunn diodes have the oscillation frequencies in a range of 70 to 130 CHz, and the results shown in FIG. 8 to FIG. 13 are obtained by using such a DC bias Vdc that Vdc/L = 40 (KV/cm) applied, with the oscillation frequency optimized, and for InP at the lattice temperature of 300K.

Figure 14:
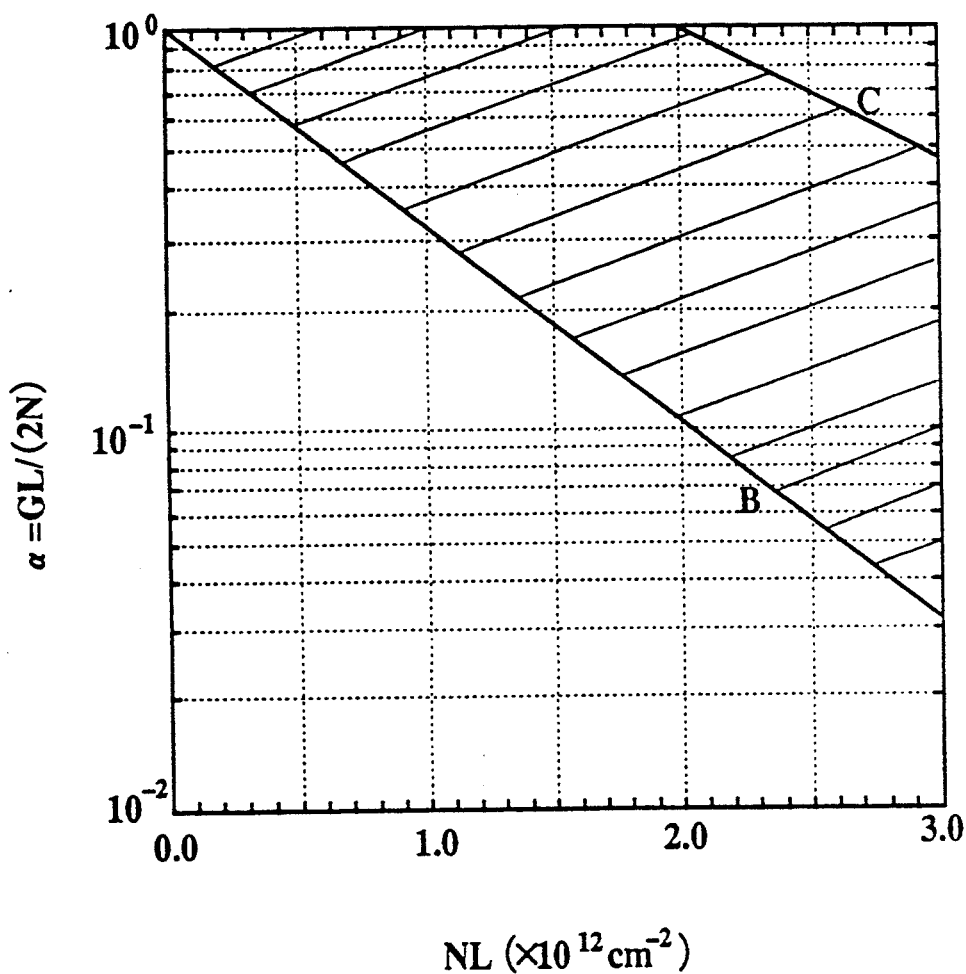
FIG. 14 is a graph of the quantity α versus a product NL showing a region of a high conversion efficiency rate obtained from the graphs of FIGS. 8 to 13, for explaining one embodiment of the present invention.

The results shown in FIG. 8 to FIG. 13 are summarized in FIG. 14 in which a region in which the conversion efficiency rate Q becomes large is indicated by a shadowed region on a graph of NL on a horizontal axis and a common logarithm of $\alpha$ on a vertical axis.

Namely, the shadowed region between the straight lines B and C is a region for which the conversion efficiency rate Q takes a value greater than 1.3, and the condition for a given Gunn diode to belong to this region defined by the straight lines B and C is expressed by the inequalities (1) and (2) described above. The fact that the dead zone is actually reduced during the oscillation operation for the Gunn diodes belonging to this region compared with the other Gunn diodes not belonging to this region had been confirmed by the numerical simulations.

Next, the numerical simulation experiment was conducted to verify that the results shown in FIG. 14 concerning a dependency of a conversion efficiency rate Q on $\alpha$ described above for a group of InP Gunn diodes having a gradient of the impurity concentration Nd(x) which is substantially constant throughout the n-type active layer has a greater generality independent of the shape of the impurity concentration distribution.

Figure 15:
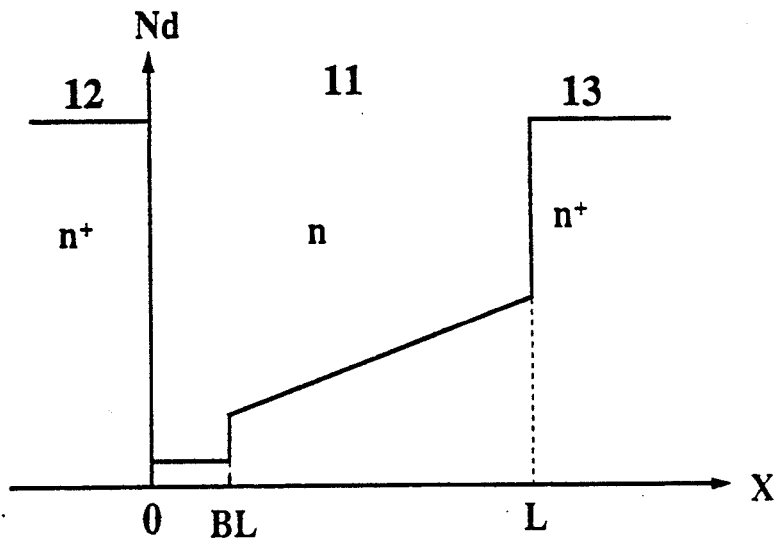
FIG. 15 is a graph of a distribution of a donor impurity concentration in another exemplary configuration of a Gunn diode according to the present invention.

Namely, the numerical simulation experiment was conducted to study a dependency of a conversion efficiency rate on Q $\alpha$ for a group of InP Gunn diodes having a substantially constant impurity concentration Nd(x) for a region in a vicinity of one end of the n-type active layer 11 and a gradient of the impurity concentration Nd(x) which is substantially constant throughout the remaining region of the n-type active layer 11, as shown in FIG. 15, in which case Nd(x) can be expressed as:

$$Nd(x) = \begin{cases} \gamma N_\phi & \text{for } 0 \leq x \leq \beta L \\ N_\phi[1 + 2\rho(x/L - \frac{1}{2})] & \text{for } \beta L \leq x \leq L \end{cases} \quad (5)$$

where $0 \leq \beta \leq 1$, and $\gamma$, $N_\phi$, $\rho$, and $\beta$ are parameters used in the simulation.

The results obtained by this experiment for the same settings of L and $N_\phi$ and various settings of $\beta$ and $\gamma$ summarized in the table 2 below are shown in FIG. 16 to FIG. 21, in which a vertical axis represents the conversion efficiency rate Q and the product NL while a horizontal axis represents $\alpha$.

TABLE 2

| FIG. No. | L (μm) | $N_\phi$ (× $10^{16}$ cm$^{-3}$) | β | γ |
|---|---|---|---|---|
| 16 | 1.1 | 1.2 | 0.05 | 0.1 |
| 17 | 1.1 | 1.2 | 0.10 | 0.1 |
| 18 | 1.1 | 1.2 | 0.15 | 0.1 |
| 19 | 1.1 | 1.2 | 0.10 | 0.5 |
| 20 | 1.1 | 1.2 | 0.25 | 0.1 |
| 21 | 1.1 | 1.2 | 0.20 | 0.1 |

These Gunn diodes have the oscillation frequencies in a range of 80 to 100 GHz, and as in the previous experiment the results shown in FIG. 16 to FIG. 21 are obtained by using such a DC bias Vdc that Vdc/L=40 (KV/cm), with the oscillation frequency optimized, and for InP at the lattice temperature of 300K.

Here, the average concentration gradient G, and therefore $\alpha$ which is related to G through the equation (3), is taken as such a value that for an approximation Nd(x)$_1$ for the impurity concentration Nd(x) given by:

$$Nd(x)_1 = N[1 + 2\alpha(x/L - \frac{1}{2})] \quad (6)$$

which is the case of a constant average concentration gradient, a quantity Z given by:

$$Z = \frac{1}{L} \int_0^L \frac{[Nd(x) - Nd(x)_1]^2}{N^2} dx \quad (7)$$

takes a minimum value.

Figure 22:
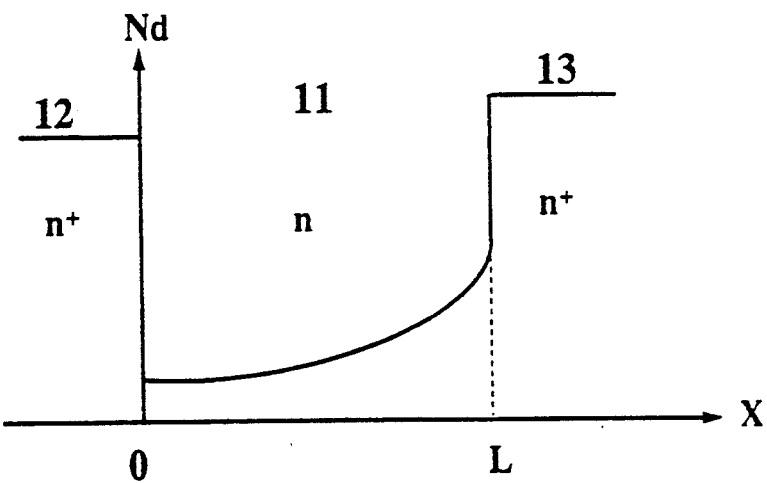
FIG. 22 is a graph of a distribution of a donor impurity concentration in still another exemplary configuration of a Gunn diode according to the present invention.
Figure 16:
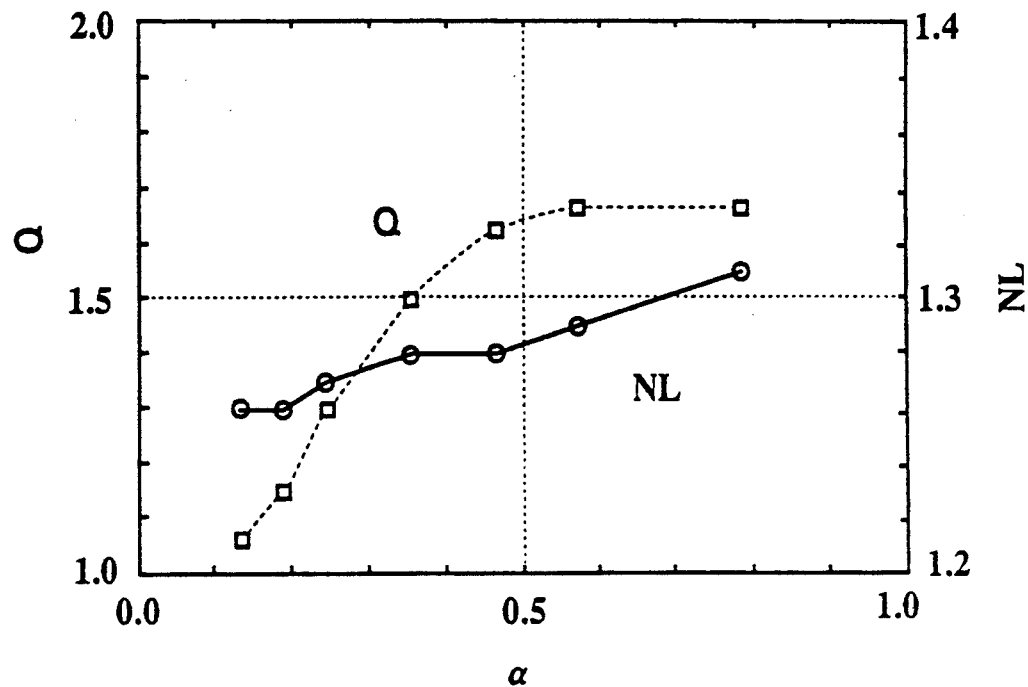
FIGS. 16 to 21 are graphs showing numerically simulated relationships between a conversion efficiency rate, a product NL, and a quantity α for the Gunn diodes having said another exemplary configuration of FIG. 15 with various settings summarized in the table 2.
Figure 17:
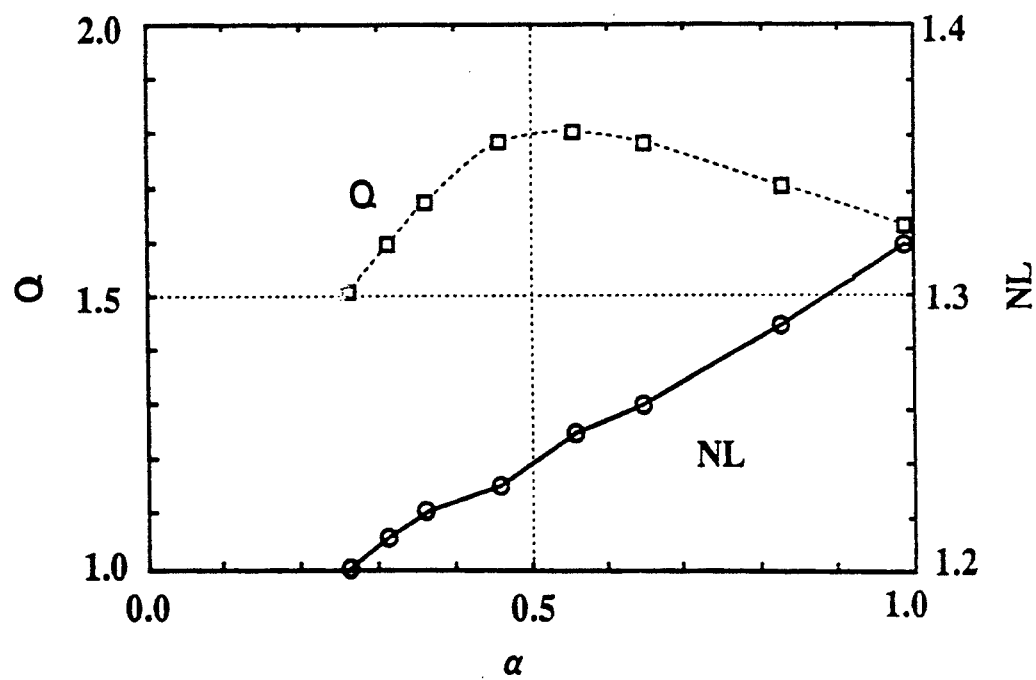
Figure 18:
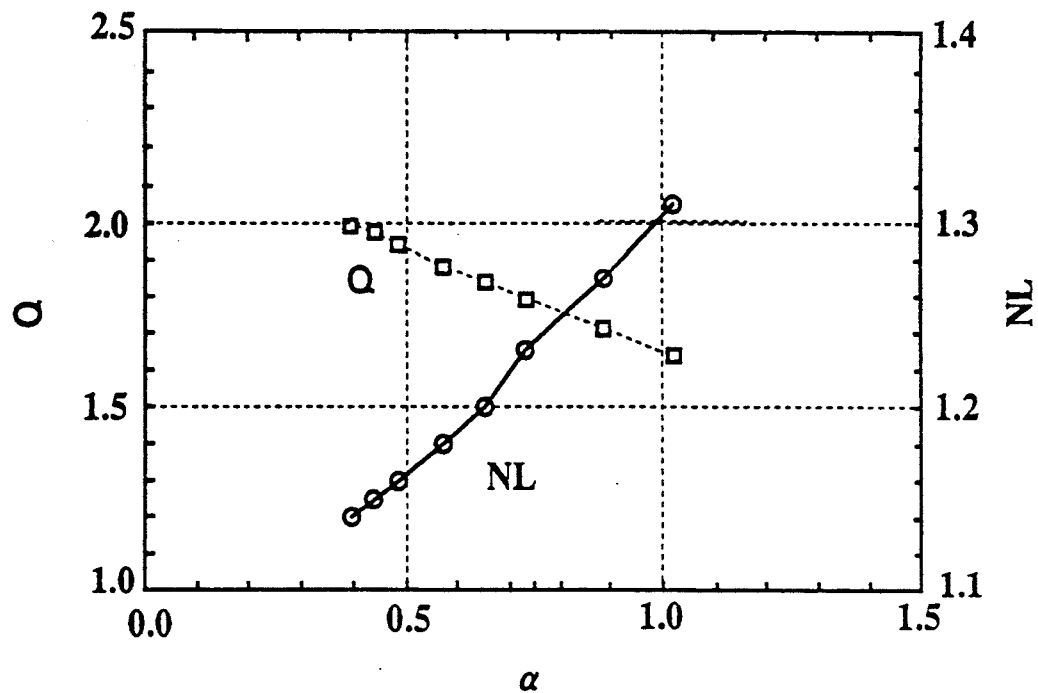
Figure 19:
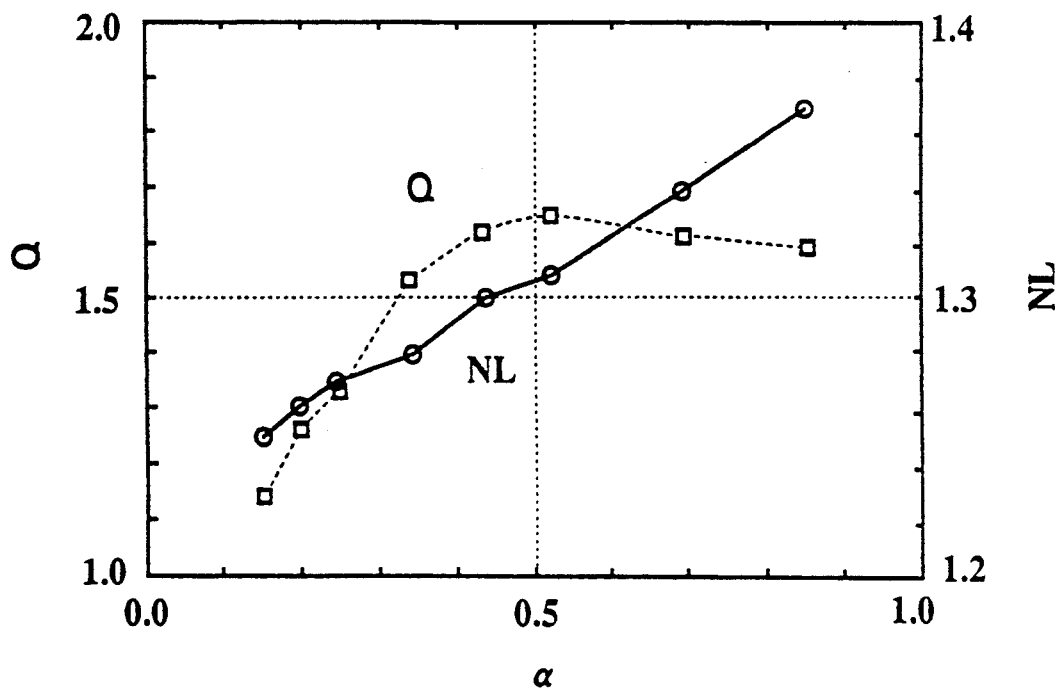
Figure 20:
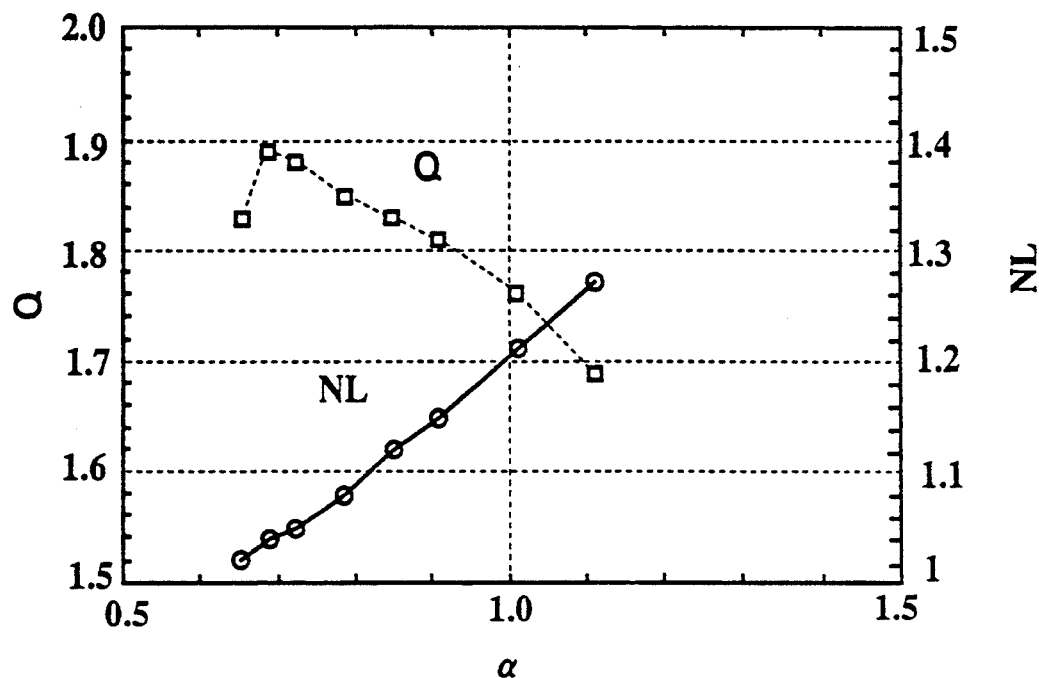
Figure 21:
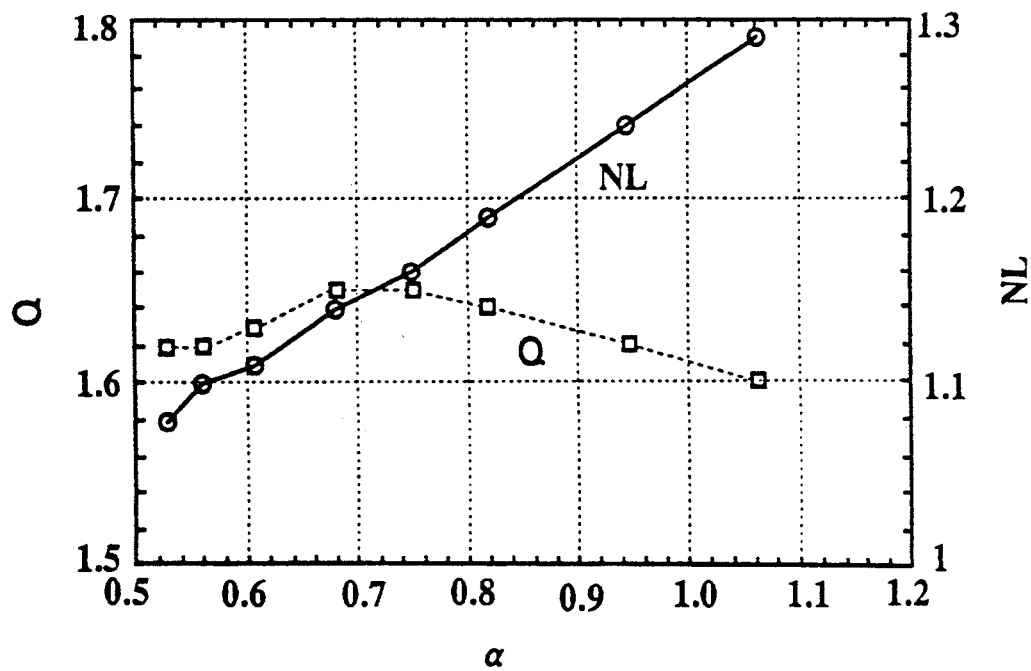

Also, the numerical simulation experiment was conducted to study a dependency of a conversion efficiency rate Q on $\alpha$ for a group of InP Gunn diodes having a gradient of the impurity concentration Nd(x) in a form of an exponential function for the n-type active layer 11, as shown in FIG. 22, in which case Nd(x) can be expressed as:

$$Nd(x) = N_\phi(1 + \mu \exp[kx/L]) \quad (8)$$

where $\mu$ and k are parameters used in the simulation.

Figure 23:
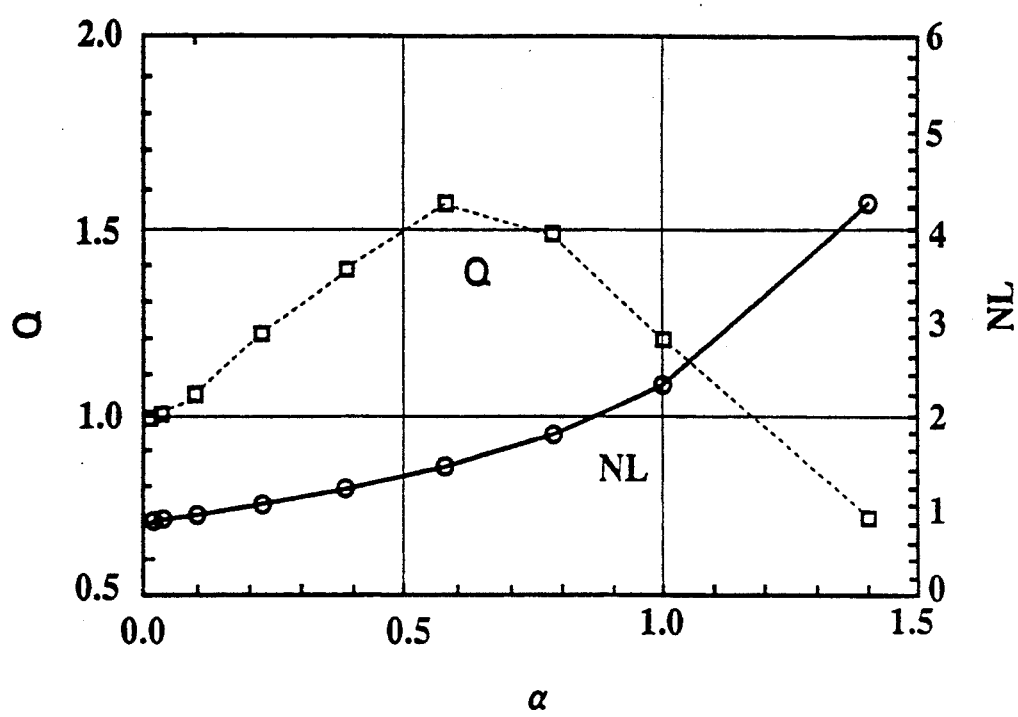
FIGS. 23 to 25 are graphs showing numerically simulated relationships between a conversion efficiency rate, a product NL, and a quantity α for the Gunn diodes having said still another exemplary configuration of FIG. 22 with various settings summarized in the table 3.
Figure 24:
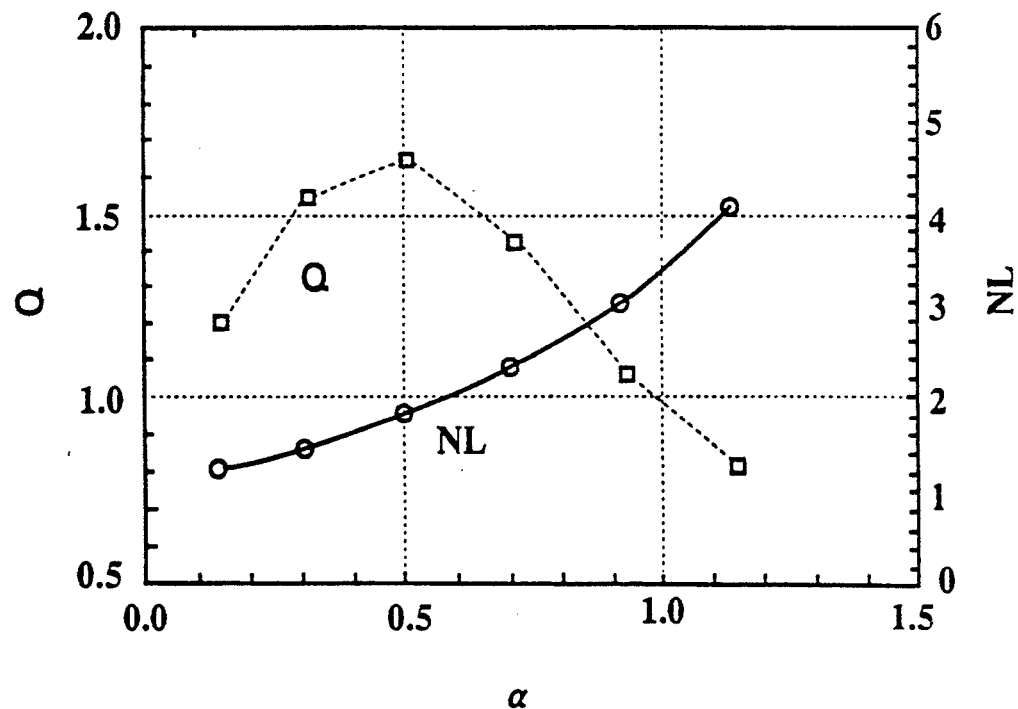
Figure 25:
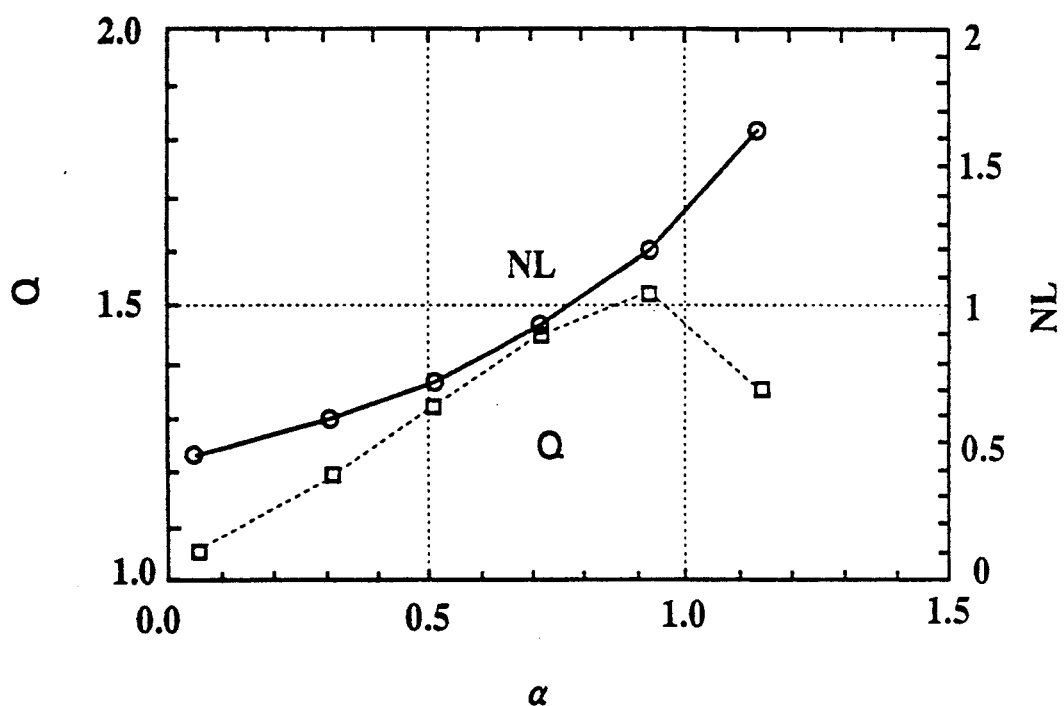

The results obtained by this experiment for the same settings of L and various settings of $N_\phi$ and $\mu$ summarized in the table 3 below are shown in FIG. 23 to FIG. 25, in which a vertical axis represents the conversion efficiency rate Q and the product NL while a horizontal axis represents $\alpha$.

TABLE 3

| FIG. No. | L (μm) | $N_\phi$ (× $10^{16}$ cm$^{-3}$) | μ |
|---|---|---|---|
| 23 | 1.1 | 0.5 | 0.5 |
| 24 | 1.1 | 0.5 | 1.0 |
| 25 | 1.1 | 0.2 | 1.0 |

These Gunn diodes have the oscillation frequencies in a range of 80 to 100 GHz, and as in the previous experiment the results shown in FIG. 23 to FIG. 25 are obtained by using such a DC bias Vdc that Vdc/L=40 (KV/cm), with the oscillation frequency optimized, and for InP at the lattice temperature of 300 K.

Figure 26:
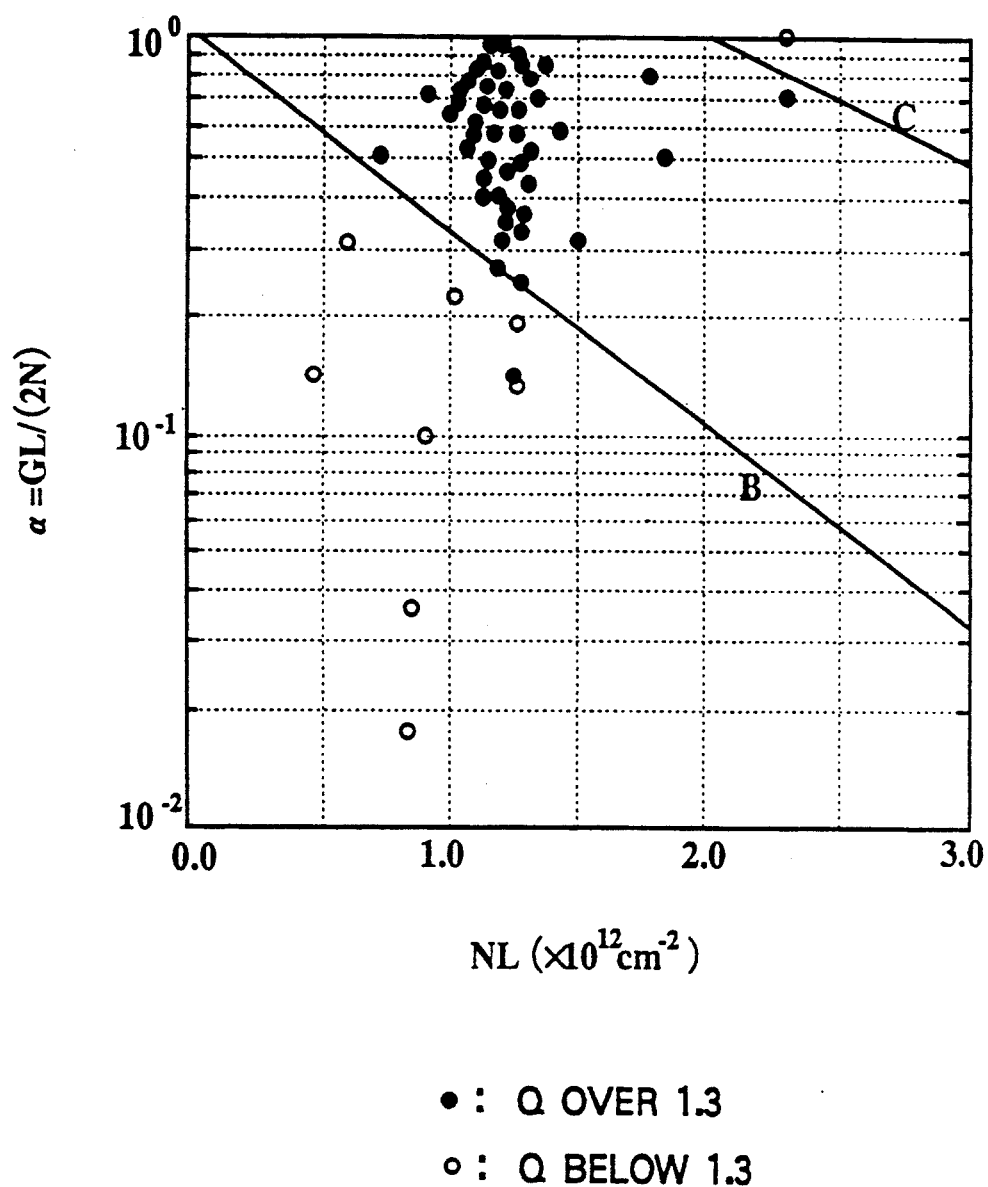
FIG. 26 is a graph of the quantity α versus a product NL showing a region of a high conversion efficiency rate obtained from the graphs of FIGS. 16 to 21 and FIGS. 23 to 25, for explaining one embodiment of the present invention.

The results shown in FIG. 16 to FIG. 21 and FIG. 23 to FIG. 25 are summarized in FIG. 26 in which a case for which the conversion efficiency rate Q takes a value greater than 1.3 is plotted by a black dot, while a case for which the conversion efficiency rate Q takes a value not greater than 1.3 is plotted by a blank dot, on a graph of NL on a horizontal axis and a common logarithm of $\alpha$ on a vertical axis. In addition, in FIG. 26, the same straight lines B and C as appeared in FIG. 14 above are also indicated. This FIG. 26 clearly shows that even for those Gunn diodes which has a non-uniform impurity concentration gradient, a region between the straight lines B and C is a region for which the conversion efficiency rate Q takes a value greater than 1.3, and the condition for a given Gunn diode to belong to this region defined by the straight lines B and C is expressed by the inequalities (1) and (2) described above. Thus, the results summarized in this FIG. 26 indicate that the results shown in FIG. 14 concerning a dependency of a conversion efficiency rate Q on $\alpha$ described above for a group of InP Gunn diodes having a gradient of the impurity concentration Nd(x) which is substantially constant throughout the n-type active layer has a greater generality independent of the form of the impurity concentration gradient. Here, however, it is to be noted that each Gunn diode used in obtaining the results of FIG. 26 has a value of a quantity Z, which indicate an extent of deviation from a case of a constant concentration gradient, to be less than 0.2.

Figure 27:
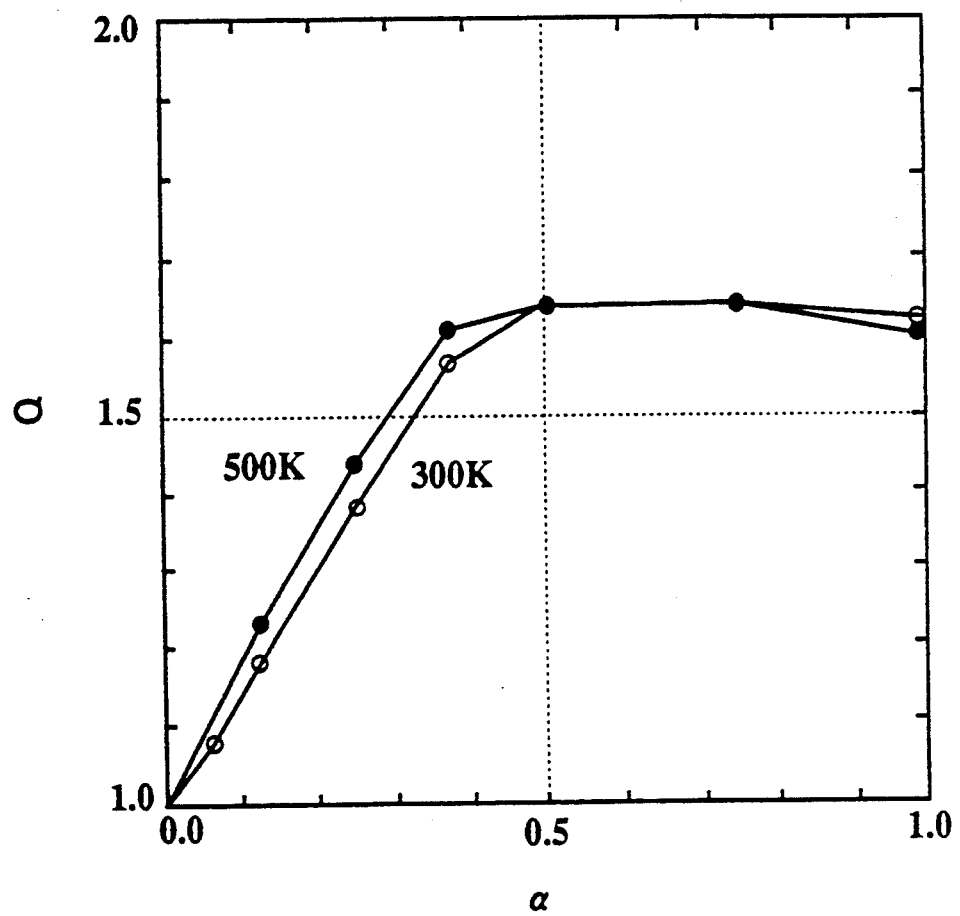
FIG. 27 is a graph showing relationships between a conversion efficiency rate and a quantity α for the Gunn diodes having said one exemplary configuration of FIG. 7, using two different lattice temperature.

It can also be shown that the results described above for a case of using the lattice temperature of 300 K. are also valid for the other lattice temperature. For example, the numerical simulation experiment was conducted to study a dependency of a conversion efficiency rate Q on $\alpha$ for a group of InP Gunn diodes having a gradient of the impurity concentration Nd(x) which is substantially constant throughout the n-type active layer, using two different lattice temperature of 300 K. and 500 K., with conditions of $N=1.2\times 10^{16}$ cm$^{-3}$, and L=1.1 μm, the result of which is shown in FIG. 27. This FIG. 27 clearly indicate that the case of using the lattice temperature of 500 K. is substantially equivalent to the case of using the lattice temperature of 300 K.

In order to further demonstrate the validity of the results obtained above, the actual InP Gunn diode samples are manufactured by the following procedure.

(a) On one side of an n-type InP substrate (with S or Sn dopant, and the impurity concentration of 2 to $5\times 10^{19}$ cm$^{-3}$), an n+-type layer 12, an n-type active layer 11, and an n+-type layer 13 are epitaxially grown. Here, the n+-type layers 12 and 13 are formed to have a thickness of 1.5 μm each, and the impurity concentration of $1\times 10^{18}$ cm$^{-3}$, while the n-type active layer 11 is formed to have a thickness of 1.1 μm and the average impurity concentration of 1.0 to $1.4\times 10^{16}$ cm$^{-3}$ with the impurity concentration distribution given by the equations (4) or (5) described above.

(b) On the n+-type layer 12, a first metallic electrode having a double layer structure comprising an ohmic metal layer such as that of AuGe and an Au film is formed.

(c) The another side of the n-type InP substrate is thinned to make the thickness of the entire Gunn diode to be 10 μm by using methods such as lapping, polishing, or etching.

(d) On that another side of the n-type InP substrate, a resist pattern having an opening of 40 μm diameter is formed by using a photolithography. Then, a second metallic electrode having a double layer structure comprising an ohmic metal layer and an Au film is formed by an evaporation of the ohmic metal, a lift-off using the resist pattern, and an Au metal plating.

(e) Using the second metallic electrode as mask, those regions of the n-type InP substrate and the n+, n, and n+ epitaxial layers on which the second metallic electrode is not formed are removed by using the etching, so as to form a column shaped mesa structure. Then, the InP Gunn diode is obtained by separating the mesa structure off.

The InP Gunn diode manufactured in this manner is then installed into a pill shaped package, and attached inside the waveguide. The maximum RF output can then be obtained by applying 4 to 6 V of the DC voltage and taking a matching of cavity impedance.

Here, when the product NL of the average impurity concentration N and the thickness L of the n-type active layer is made larger, the DC input power increases and the heat release becomes difficult, so that it is preferable to make a value of this product NL to be not greater than $2.0\times 10^{12}$ cm$^{-2}$, or more preferably, to be 1.0 to $1.5\times 10^{12}$ cm$^{-2}$.

It is also noted that the Gunn diodes of the types shown in FIG. 15 and FIG. 22 can also be manufactured in the manner similar to that just described for the Gunn diode of a type shown in FIG. 7, by using the impurity concentration gradient given by the equation (5) or (8) instead of the equation (4) at the step (a) of the above procedure.

With this procedure, using various settings summarized in the table 4 below, the following 16 InP Gunn diode samples of types shown in FIG. 7 or FIG. 15 are manufactured.

TABLE 4

| Diode No. | L (μm) | $N_\phi$ ($\times 10^{16}$ cm$^{-3}$) | β | γ | ρ |
|---|---|---|---|---|---|
| 1 | 1.1 | 1.2 | 0 | 0 | 0 |
| 2 | 1.1 | 1.4 | 0 | 0 | 0 |
| 3 | 1.1 | 1.2 | 0 | 0 | 0.125 |
| 4 | 1.1 | 1.4 | 0 | 0 | 0.125 |
| 5 | 1.1 | 1.2 | 0 | 0 | 0.250 |
| 6 | 1.1 | 1.4 | 0 | 0 | 0.250 |
| 7 | 1.1 | 1.2 | 0.091 | 0 | 0.250 |
| 8 | 1.1 | 1.2 | 0.091 | 0 | 0.375 |
| 9 | 1.1 | 1.3 | 0 | 0 | 0.375 |
| 10 | 1.1 | 1.0 | 0.091 | 0 | 0.25 |
| 11 | 1.1 | 1.2 | 0 | 0 | 0.5 |
| 12 | 1.1 | 1.4 | 0 | 0 | 0.5 |
| 13 | 1.1 | 1.0 | 0 | 0 | 0 |
| 14 | 1.1 | 1.0 | 0 | 0 | 0.125 |
| 15 | 1.1 | 1.0 | 0 | 0 | 0.25 |
| 16 | 1.1 | 1.0 | 0 | 0 | 0.5 |

These Gunn diodes have the oscillation frequency of about 94 GHz.

Then, the conversion efficiencies of these InP Gunn diode samples are actually measured, the result of which is summarized in the table 5 below.

TABLE 5

| Diode No. | eff (%) | N ($\times 10^{16}$ cm$^{-3}$) | α | Q | Z | NL (x $\times 10^{12}$ cm$^{-2}$) |
|---|---|---|---|---|---|---|
| 1 | 1.5 | 1.2 | 0 | 1 | 0 | 1.32 |
| 2 | 1.4 | 1.4 | 0 | 1 | 0 | 1.54 |
| 3 | 1.6 | 1.2 | 0.125 | 1.07 | 0 | 1.32 |
| 4 | 1.8 | 1.4 | 0.125 | 1.29 | 0 | 1.54 |
| 5 | 2.6 | 1.2 | 0.250 | 1.73 | 0 | 1.32 |
| 6 | 2.8 | 1.4 | 0.250 | 2.00 | 0 | 1.54 |
| 7 | 2.4 | 1.11 | 0.498 | (1.6) | 0.050 | 1.22 |
| 8 | 2.9 | 1.12 | 0.593 | (1.9) | 0.041 | 1.23 |
| 9 | 2.6 | 1.3 | 0.375 | (1.7) | 0 | 1.43 |
| 10 | 2.3 | 0.92 | 0.498 | 1.78 | 0.050 | 1.01 |
| 11 | 1.8 | 1.2 | 0.5 | 1.20 | 0 | 1.32 |
| 12 | 1.5 | 1.4 | 0.5 | 1.07 | 0 | 1.54 |
| 13 | 1.3 | 1.0 | 0 | 1 | 0 | 1.1 |
| 14 | 1.7 | 1.0 | 0.125 | 1.31 | 0 | 1.1 |
| 15 | 1.2 | 1.0 | 0.250 | 0.9 | 0 | 1.1 |
| 16 | 1.1 | 1.0 | 0.5 | 0.85 | 0 | 1.1 |

In the Table 5, those conversion efficiency rates Q which are bracketed are the values obtained by using Gunn diodes having the uniform impurity concentration distribution with somewhat different values for N and L as references with respect to which the rates are to be calculated, because the data on the conversion efficiencies of the Gunn diodes having the uniform impurity concentration distribution with the same values for N and L as these samples were not available.

Figure 28:
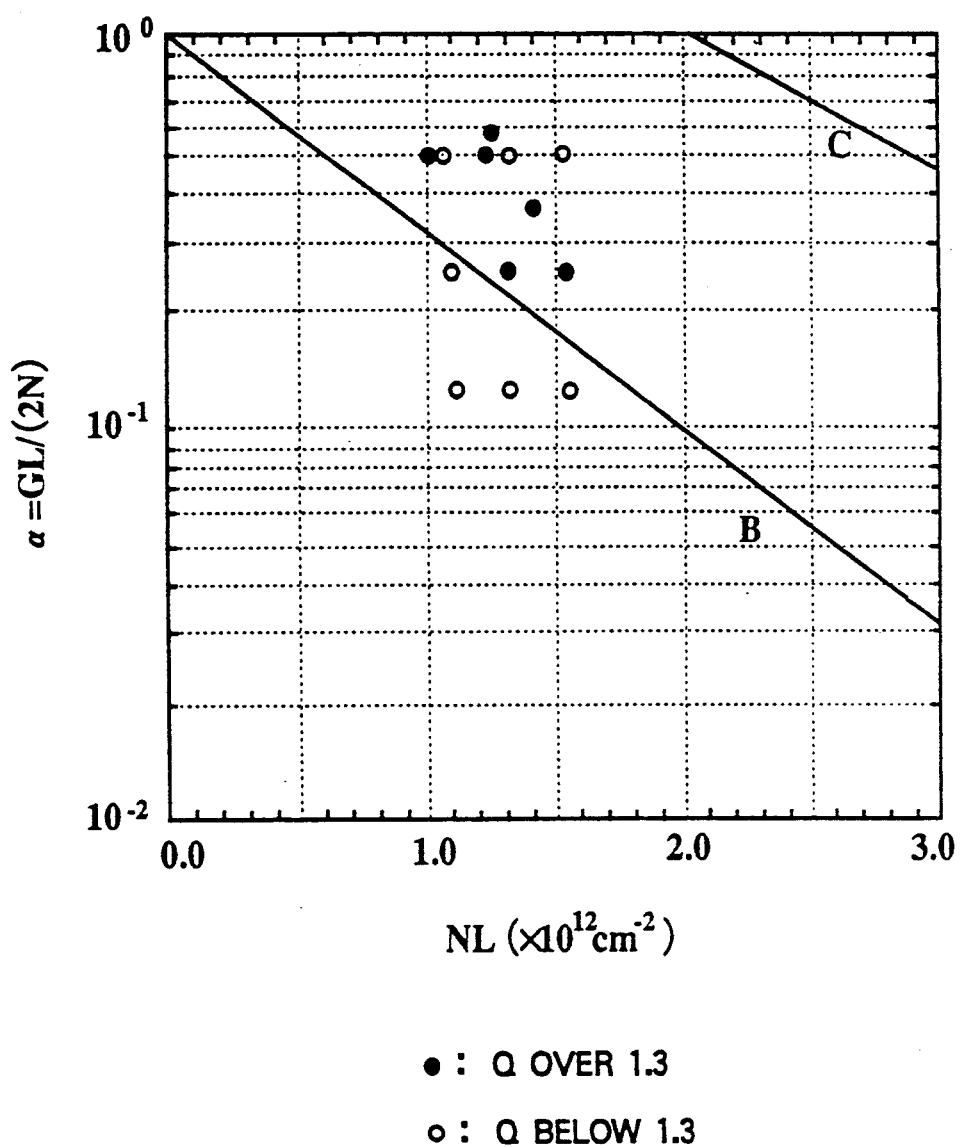
FIG. 28 is a graph of the quantity α versus a product NL showing a region of a high conversion efficiency rate obtained from the Gunn diode samples having the exemplary configurations of FIG. 7 and FIG. 15 with various settings summarized in the tables 4 and 5.

The results shown in the Table 4 and Table 5 are summarized in FIG. 28 in which a case for which the conversion efficiency rate Q takes a value greater than 1.3 is plotted by a black dot, while a case for which the conversion efficiency rate Q takes a value not greater than 1.3 is plotted by a blank dot, on a graph of NL on a horizontal axis and a common logarithm of α on a vertical axis. In addition, in FIG. 28, the same straight lines B and C as appeared in FIG. 14 above are also indicated. This FIG. 28 clearly shows that for the actually manufactured Gunn diodes, a region between the straight lines B and C is a region for which the conversion efficiency rate Q takes a value greater than 1.3, and the condition for a given Gunn diode to belong to this region defined by the straight lines B and C is expressed by the inequalities (1) and (2) described above, in agreement with the result obtained from FIG. 14 above.

Thus, according to the present invention, the Gunn diode is formed such that the donor impurity concentration in the n-type active layer is graded along a direction perpendicular to a contact plane between the n-type active layer and the n+-type layers, and its average concentration gradient G simultaneously satisfies the two inequalities (1) and (2), so that it becomes possible to provide a Gunn diode in which the conversion efficiency can be improved without lowering the reliability, by reducing the dead zone while maintaining n+nn+ structure.

Now, in a manner similar to that described above, according to another embodiment of the present invention, it is also preferable for the average concentration gradient G to simultaneously satisfy the following three inequalities:

$$G > (A_1 N/L) \exp(-NL/S_3) \quad (9)$$

$$G < (A_3 N/L) \exp(-NL/S_4) \quad (10)$$

$$G < 2N/L \quad (11)$$

where $S_3 = 1.2 \times 10^{12}$ cm$^{-2}$ is a constant, $S_4 = 4.0 \times 10^{12}$ cm$^{-2}$ is a constant, and $A_4 = 3.4$ is a constant.

This configuration also has an advantage of preventing the appearance of the dead zone and thereby improving the conversion efficiency without lowering the reliability while maintaining the n+nn+ structure, for the reason similar to that explained in detail above.

In order to verify the above conditions given by the inequalities (9), (10), and (11), the numerical simulation experiment was conducted to study a dependency of a conversion efficiency rate Q on $\alpha$ for a group of InP Gunn diodes having a gradient of the impurity concentration Nd(x) which is substantially constant throughout the n-type active layer as shown in FIG. 7, in which case Nd(x) can be expressed by the equation (4) described above, using the oscillation frequencies of 78 GHz, 94 GHz, and 118 GHz.

The results obtained by this experiment for various settings of L and N summarized in the table 6 below are shown in FIG. 29 to FIG. 33 in which a vertical axis represents the conversion efficiency in absolute units while a horizontal axis represents $\alpha$.

TABLE 6

| FIG. No. | L (μm) | N (× 10$^{16}$ cm$^{-3}$) | Oscillation Frequency (GHz) |
|---|---|---|---|
| 29 | 1.0 | 1.8 | 94 |
| 30 | 1.0 | 3.6 | 94 |
| 31 | 1.0 | 2.6 | 94 |
| 32 | 1.2 | 1.8 | 78 |
| 33 | 1.1 | 0.6 | 118 |

Figure 29:
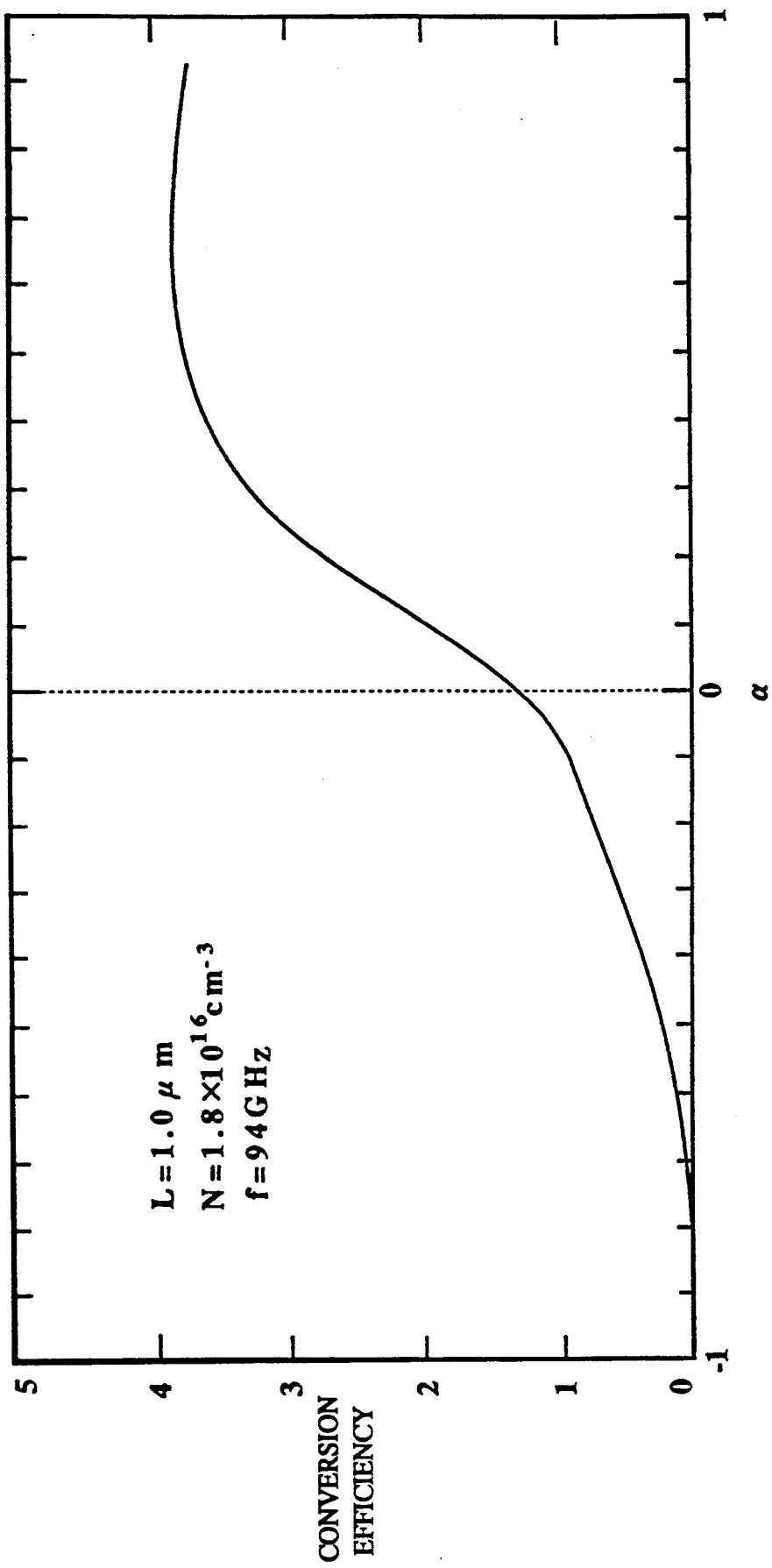
FIGS. 29 to 33 are graphs showing numerically simulated relationships between a conversion efficiency and a quantity $\alpha$ for the Gunn diodes having said one exemplary configuration of FIG. 7 with various settings summarized in the table 6.
Figure 30:
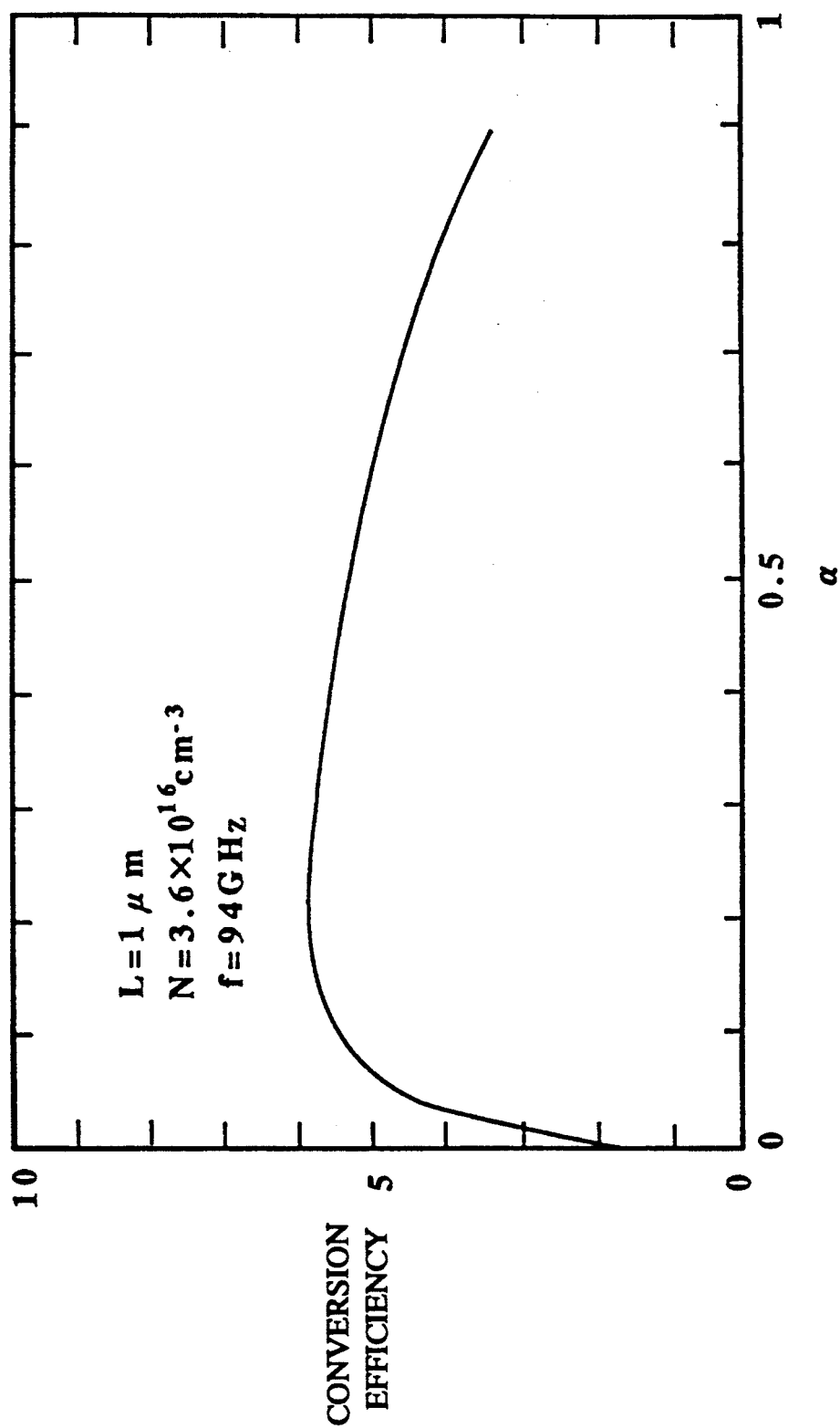
Figure 31:
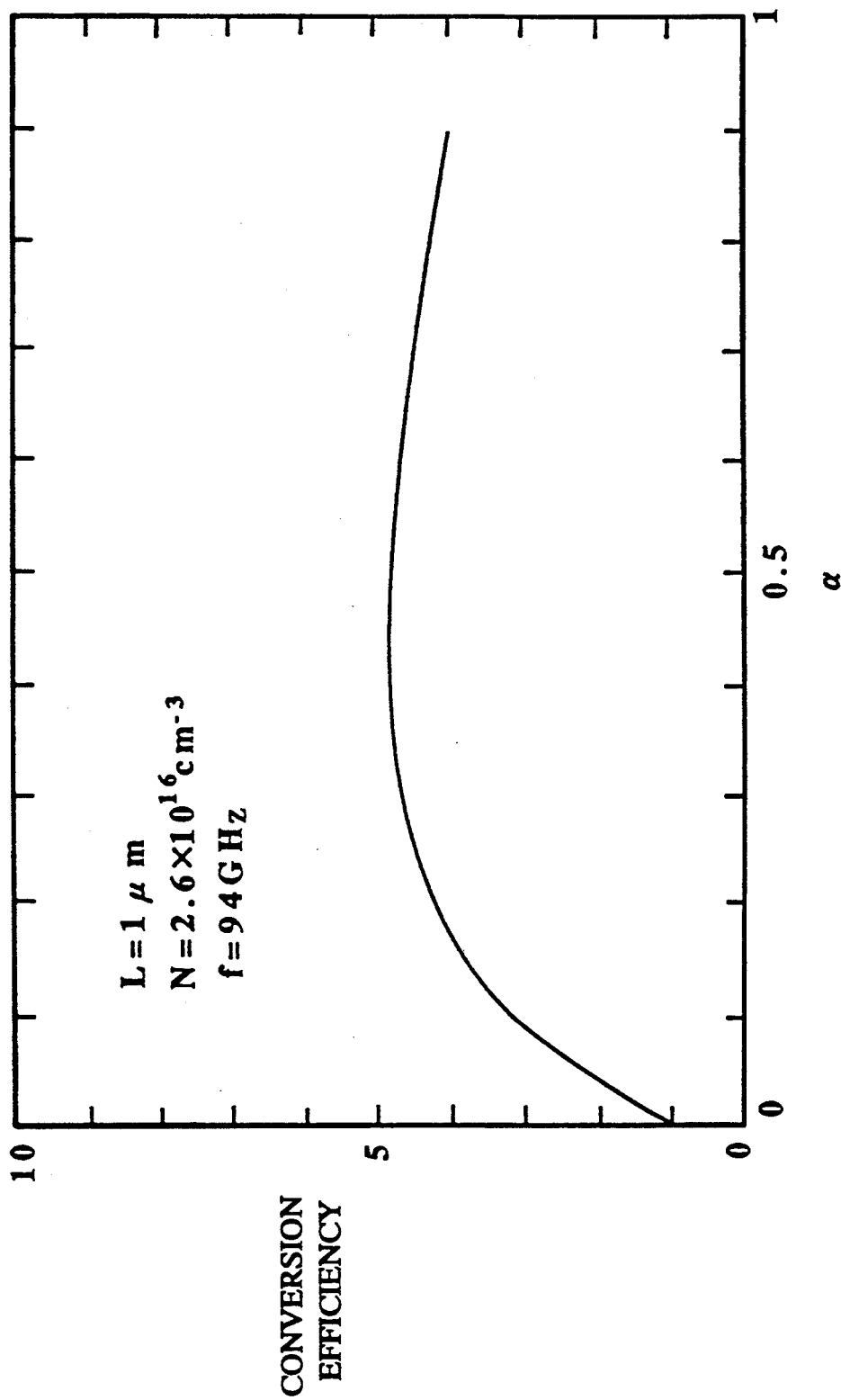
Figure 32:
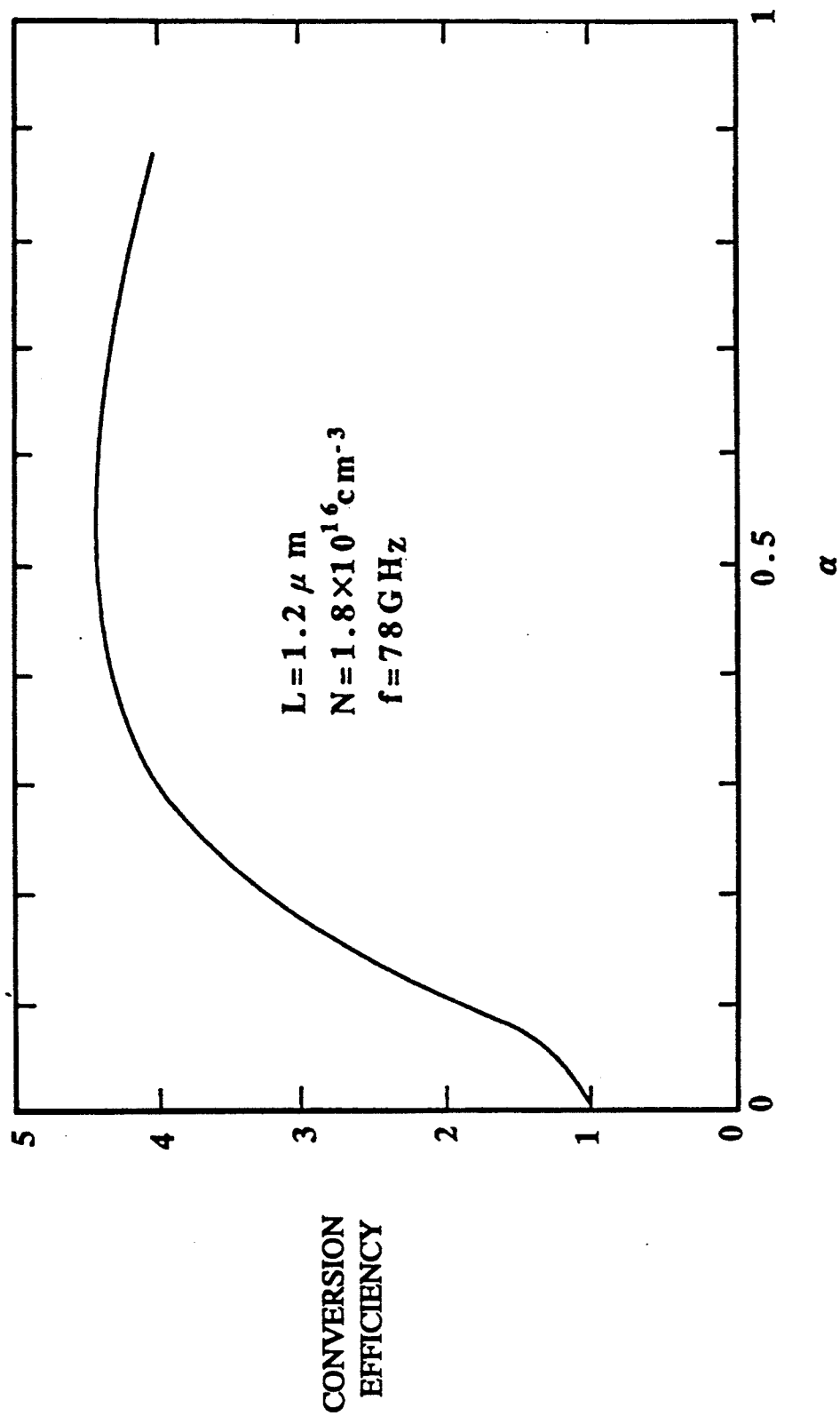
Figure 33:
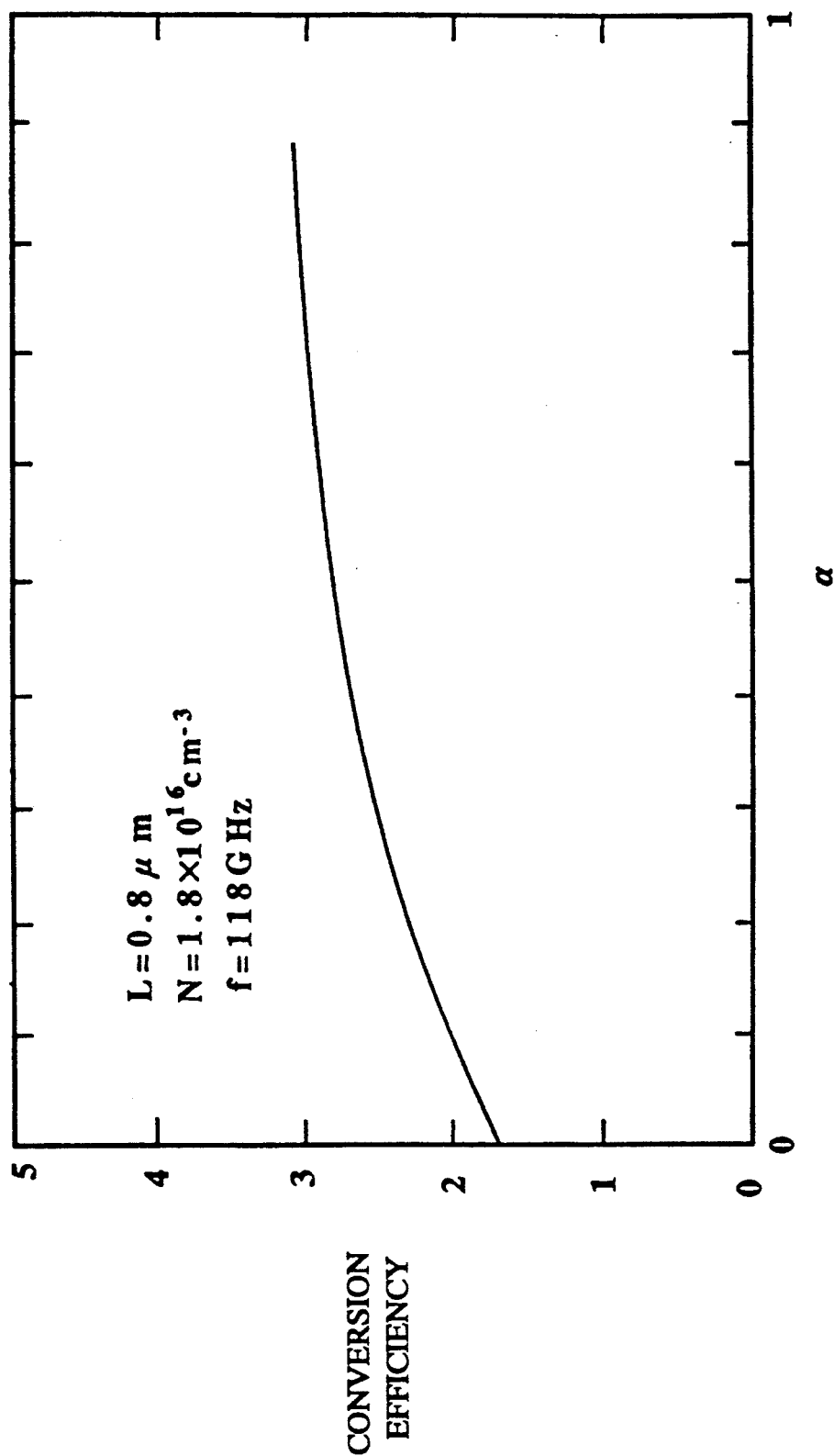

In FIG. 29, $\alpha$ is taken as positive when the side having the lower donor impurity concentration is used as the cathode side, whereas $\alpha$ is taken as negative when the side having the lower donor impurity concentration is used as the anode side.

Figure 34:
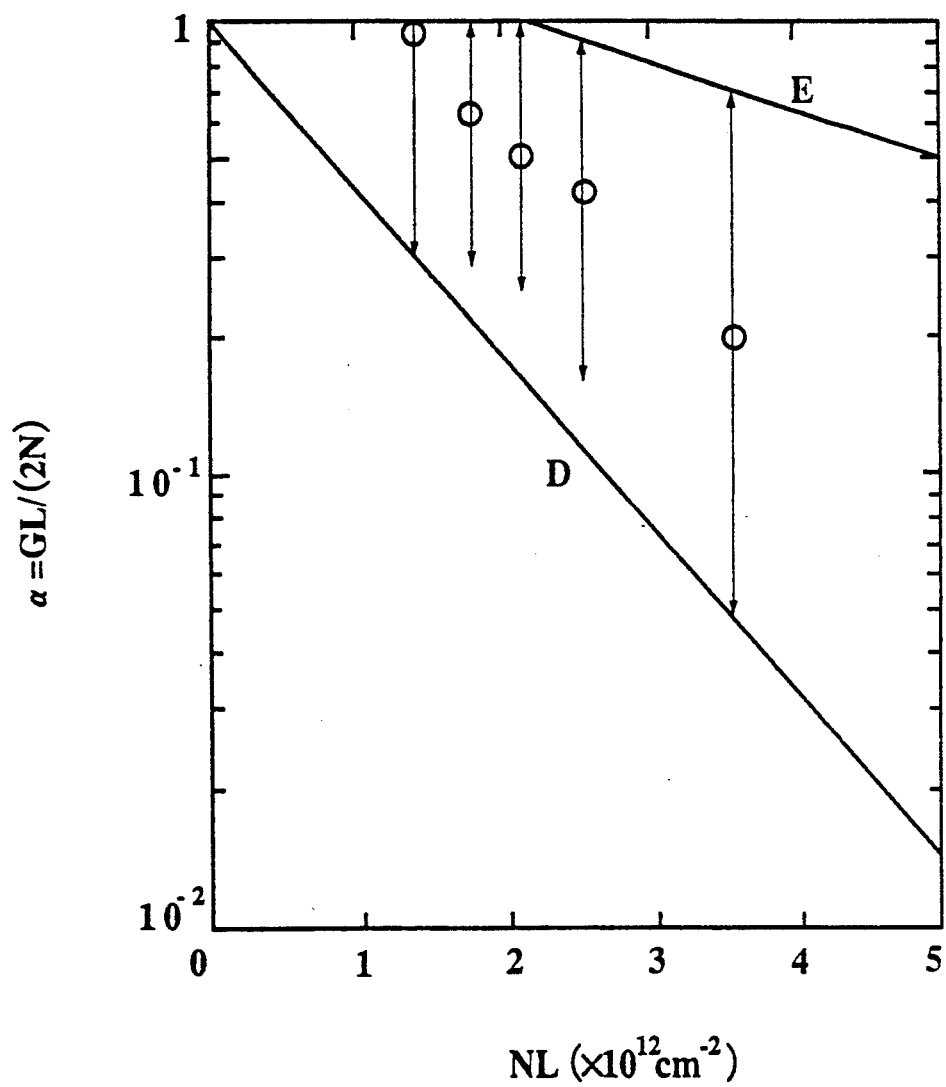
FIG. 34 is a graph of the quantity $\alpha$ versus a product NL showing a region of a high conversion efficiency obtained from the graphs of FIGS. 29 to 33, for explaining another embodiment of the present invention.

The results shown in FIG. 29 to FIG. 33 are summarized in FIG. 34 in which a point of a maximum conversion efficiency is indicated by a blank dot and a range for the conversion efficiency of over 80% of the maximum conversion efficiency is indicated by arrows associated with the blank dot, on a graph of NL on a horizontal axis and a common logarithm of $\alpha$ on a vertical axis. On a basis of these data, a region between the straight lines D and E can be regarded as a region of the high conversion efficiency, and the condition for a given Gunn diode to belong to this region defined by the straight lines D and E is expressed by the inequalities (9) and (10) described above. In addition, the inequality (11) expresses the fact that a value of $\alpha$ is physically limited to be not greater than 1. The fact that the dead zone is actually reduced during the oscillation operation for the Gunn diodes belonging to this region compared with the other Gunn diodes not belonging to this region had been confirmed by the numerical simulations.

Thus, according to this another embodiment of the present invention, the Gunn diode can also be formed such that the donor impurity concentration in the n-type active layer is graded along a direction perpendicular to a contact plane between the n-type active layer and the n+-type layers, and its average concentration gradient G simultaneously satisfies the three inequalities (9), (10) and (11), so that it becomes possible to provide a Gunn diode in which the conversion efficiency can be improved without lowering the reliability, by removing the dead zone completely, while maintaining n+ nn+ structure.

It is to be noted that the various additional preferable features described above for the previous embodiment are also applicable to this embodiment in the similar manner.

It is also to be noted that in the above described embodiments, the donor impurity concentration Nd should be considered as a macroscopic quantity obtained by averaging the microscopic donor impurity concentrations over the Debye length of the conduction electrons, because strictly speaking the microscopic impurity concentration can fluctuate spatially, so that the concentration gradient cannot be controlled as exactly as required by the inequalities (1) and (2) or (9) to (11) on a microscopic level.

It is further to be noted that many modifications and variations of the above embodiments may be made without departing from the novel and advantageous features of the present invention. Accordingly, all such modifications and variations are intended to be included within the scope of the appended claims.

What is claimed is:

1. A Gunn diode, comprising:
   an n-type active layer made of an InP semiconductor body;
   two n+-type layers sandwiching the n-type active layer, each of which is having a donor concentration greater than the n-type active layer and connected with a metallic electrode;
   wherein the donor impurity concentration in the n-type active layer is graded along a direction perpendicular to a contact plane between the n-type active layer and the n+-type layers, and an average concentration gradient G of the donor impurity concentration in the n-type active layer simultaneously satisfies the following two inequalities:

$$G > (A_1 N/L) \exp(-NL/S_1)$$

$$G < (A_2 N/L) \exp(-NL/S_2)$$

where L is a thickness of the n-type layer, N is an average concentration of the donor impurity in the n-type active layer, $S_1 = 0.87 \times 10^{12}$ cm$^{-2}$ is a constant, $S_2 = 1.32 \times 10^{12}$ cm$^{-2}$ is a constant, $A_1 = 2.0$ is a constant, and $A_2 = 9.0$ is a constant; and the n-type active layer has a thickness L not greater than 1.5 μm, while the product NL of the thickness L of the n-type active layer and the average concentration N of the donor impurity is not greater than $2.0 \times 10^{12}$ cm$^{-2}$.

2. The Gunn diode of claim 1, wherein the average concentration gradient of the donor impurity concentration in the n-type active layer is substantially constant throughout the n-type active layer.

3. The Gunn diode of claim 1, wherein the donor impurity concentration of the n-type active layer is constant at a prescribed region neighboring one end of the n-type active layer, and has a substantially constant concentration gradient in a remaining region of the n-type active layer.

4. The Gunn diode of claim 1, wherein the average concentration gradient of the donor impurity concentration in the n-type active layer is in a form of an exponential function throughout the n-type active layer.

5. The Gunn diode of claim 1, wherein the product NL of the thickness L of the n-type active layer and the average concentration N of the donor impurity is within a range of 1.0 to $1.5 \times 10^{12}$ cm$^{-2}$.

6. A Gunn diode, comprising:
an n-type active layer made of an InP semiconductor body;
two n$^+$-type layers sandwiching the n-type active layer, each of which is having a donor concentration greater than the n-type active layer and connected with a metallic electrode;
wherein the donor impurity concentration in the n-type active layer is graded along a direction perpendicular to a contact plane between the n-type active layer and the n$^+$-type layers, and an average concentration gradient G of the donor impurity concentration in the n-type active layer simultaneously satisfies the following three inequalities:

$$G > (A_1 N/L) \exp(-NL/S_3)$$

$$G < (A_3 N/L) \exp(-NL/S_4)$$

$$G < 2N/L$$

where L is a thickness of the n-type active layer, N is an average concentration of the donor impurity in the n-type active layer, $S_3 = 1.2 \times 10^{12}$ cm$^{-2}$ is a constant, $S_4 = 4.0 \times 10^{12}$ cm$^{-2}$ is a constant, $A_1 = 2.0$ is a constant, and $A_3 = 3.4$ is a constant; and the n-type active layer has a thickness L not greater than 1.5 μm, while the product NL of the thickness L of the n-type active layer and the average concentration N of the donor impurity is not greater than $2.0 \times 10^{12}$ cm$^{-2}$.

7. The Gunn diode of claim 6, wherein the average concentration gradient of the donor impurity concentration in the n-type active layer is substantially constant throughout the n-type active layer.

8. The Gunn diode of claim 6, wherein the donor impurity concentration of the n-type active layer is constant at a prescribed region neighboring one end of the n-type active layer, and has a substantially constant concentration gradient in a remaining region of the n-type active layer.

9. The Gunn diode of claim 6, wherein the average concentration gradient of the donor impurity concentration in the n-type active layer is in a form of an exponential function throughout the n-type active layer.

10. The Gunn diode of claim 6, wherein the product NL of the thickness L of the n-type active layer and the average concentration N of the donor impurity is within a range of 1.0 to $1.5 \times 10^{12}$ cm$^{-2}$.

* * * * *